(12) United States Patent
Sasaki et al.

(10) Patent No.: US 6,754,876 B2
(45) Date of Patent: Jun. 22, 2004

(54) SYSTEM AND METHOD FOR DESIGNING A PRINTED BOARD ADAPTED TO SUPPRESS ELECTROMAGNETIC INTERFERENCE

(75) Inventors: Hideki Sasaki, Tokyo (JP); Takashi Harada, Tokyo (JP); Toshihide Kuriyama, Tokyo (JP)

(73) Assignee: NEC Corporation, Tokyo (JP)

( * ) Notice: Subject to any disclaimer, the term of this patent is extended or adjusted under 35 U.S.C. 154(b) by 309 days.

(21) Appl. No.: 09/902,642

(22) Filed: Jul. 12, 2001

(65) Prior Publication Data

US 2002/0010898 A1 Jan. 24, 2002

(30) Foreign Application Priority Data

Jul. 12, 2000 (JP) ........................................ 2000-211754

(51) Int. Cl.⁷ ........................ G06F 17/50; G06F 9/455; H03K 17/693

(52) U.S. Cl. ................................ 716/1; 716/2; 716/11; 716/15

(58) Field of Search ................................ 716/1, 15, 11, 716/2

(56) References Cited

U.S. PATENT DOCUMENTS

| | | | | |
|---|---|---|---|---|
| 6,353,540 B1 | * | 3/2002 | Akiba et al. | 361/794 |
| 6,359,237 B1 | * | 3/2002 | Tohya et al. | 174/261 |
| 6,477,694 B1 | * | 11/2002 | Irino et al. | 716/15 |
| 6,557,154 B1 | * | 4/2003 | Harada et al. | 716/11 |
| 2001/0018761 A1 | * | 8/2001 | Sasaki et al. | 716/15 |

FOREIGN PATENT DOCUMENTS

| | | |
|---|---|---|
| JP | 10-49568 | 2/1998 |
| JP | 10-91663 | 4/1998 |

OTHER PUBLICATIONS

C.J. Fisk et al., Topographic Simulation As An Aid to Printed Circuit Board Design, Proceedings of the 4$^{th}$ Conference on Desig Automation, pp. 17.1–17.23, Jan. 1967.*
F. Leferink, Reduction Of Printed Circuit Board Radiated Emission, IEEE 1997 International Symposium on Electromagnetic Compatibility, pp. 431–438, Aug. 1997.*
T. Hara et al., Analysis of Radiation Noise Caused by Power Distribution on MultiLayer Printed Circuit Board, 1999 International Symposium on Electromagnetic Compatibility, pp. 5–8, May 1999.*
T. Harada et al., Radiated Emission Arising From Power Distribution in MultiLayer Printed Circuit Boards, IEEE International Symposium on Electromagnetic Compatibility, pp. 518–522, Aug. 1997.*
H. Sasaki et al., The Relationship Between Common–Mode Radiation From the Ground Plane and Differential–Mode Radiation From Signal Traces On the Ground Plane, 2002 IEEE International Symposium on Electromagnetic Compatibility, pp. 195–199, Aug. 2002.*
S. Caniggia et al., Investigation of EMI on MultiLayer Printed Circuit Boards Radiated Emissions, IEEE International Symposium on Electromagnetic Compatibility, pp. 316–321, Aug. 1996.*
M. Welt, NOMAD: A Printed Wiring Board Layout System, Proceedings of the 12$^{th}$ Design Automation Conference, pp. 152–161, Jan. 1975.*

* cited by examiner

Primary Examiner—A. M. Thompson
(74) Attorney, Agent, or Firm—Foley & Lardner

(57) ABSTRACT

A design support system utilizes an information processor for supporting a printed board design. The design support system includes a first unit for designing a printed board that includes at least a ground layer. The design support system also includes a second unit for finding at least one resonant frequency for the ground layer based on information of a resonance-significant size of the ground layer. This information can be used to suppress electromagnetic interference from a printed board.

101 Claims, 22 Drawing Sheets

SYSTEM AND METHOD FOR DESIGNING A PRINTED BOARD ADAPTED TO SUPPRESS ELECTROMAGNETIC INTERFERENCE

BACKGROUND OF THE INVENTION

1. Field of the Invention

The present invention relates to a design support system utilizing an information processor for supporting a design of a printed board, and a method of supporting a design of a printed board, as well as a design support program to be implemented by the design support system. The present invention more particularly relates to a design support system for supporting a design of a printed board for suppressing electromagnetic interference from a printed board, and a method of supporting a design of a printed board for suppressing electromagnetic interference from a printed board, as well as a design support program to be implemented by the design support system for suppressing electromagnetic interference from a printed board.

2. Description of the Related Art

Undesired electromagnetic wave radiated or emitted from electric, electronic or electron devices may cause electromagnetic interference. The electromagnetic interference may be influential to any broadcastings and any communications. Various national regulations to the electromagnetic interference have been established in various countries. Some international regulations have also been established. CISPR international regulation is a typical one of the existent international regulations.

A frequency band, which is at present subject to the regulation, is ranged from 30 MHz through 1 GHz. It is necessary for manufacturing companies to suppress the electromagnetic interference of their products into a regulatory acceptable range. A measurement of the electromagnetic interference of the final products is made in accordance with the regulation. The measurement is thus made after the final products have been completed, and is sometimes made just before shipping of the final products. In case, just before shipping of the final products, it can be confirmed that the final products do not satisfy the regulations for the electromagnetic interference. A prompt counter-measurement thereto is needed, wherein additional parts may be placed to the products or a redesign of the products or a modification to the products may be made alternatively. These countermeasurements may cause some delay in shipping the final products allowable in the regulations for the electromagnetic interference, or some increase in the manufacturing costs.

Another method for solving the above problems was proposed, wherein a system and a method of designing a printed board adopted to suppress the electromagnetic interference. The printed board is the main factor for causing the electromagnetic interference. The other design support system for the printed board has an additional design function for suppressing the electromagnetic interference. Japanese laid-open patent application No. 10-49568 discloses a circuit board design method and a storage medium. Japanese laid-open patent application No. 10-91663 also discloses a printed board computer-aided design system.

FIG. 1 is a flow chart of respective steps involved in a conventional layout method for the printed board disclosed in Japanese laid-open patent application No. 10-49568. It is considered that the electromagnetic interference caused by electromagnetic wave emitted from signal lines on the printed board is dominant for the electromagnetic interference problem with the printed board. In this viewpoint, a quantity of radiation of the electromagnetic wave causing the electromagnetic interference from the signal lines is estimated or calculated. If the calculated quantity of radiation exceeds the upper limit, then any counter-measure is made and an optimum layout for realizing the counter-measure is also decided.

FIG. 2 is a schematic view explaining operations of the conventional printed board CAD system disclosed in Japanese laid-open patent application No. 10-91663. If a wiring is designated on the CAD system, then a quantity of radiation of the electromagnetic wave causing the electromagnetic interference from the designated wiring is calculated by the CAD system based on given information about signal waveform associated with the designated wiring. Subsequently, another wiring is designated and then the same operations as described above are again made. Those processes are sequentially made for some or all of the wirings on the printed board, whereby a distribution in the calculated quantity of the electromagnetic interference over two-dimensional positions is obtained.

This two-dimensional distribution is visibly displayed for identifying the positions of the signal wirings emitting the electromagnetic waves causing the electromagnetic interference. This makes it easy to take an possible effective counter-measure to the electromagnetic interference.

The above described two conventional design support systems are adopted to suppress electromagnetic wave radiation from the signal wirings on the printed board. This electromagnetic wave radiation is so called to as "normal mode radiation" or "differential mode radiation". A "common mode radiation" is different from the "normal mode radiation" or "differential mode radiation". This "common mode radiation" also causes the electromagnetic interference from the printed board. In majority cases, the "common mode radiation" may be dominant over the "normal mode radiation" or "differential mode radiation".

A "normal mode current" causes the "normal mode radiation". A "common mode current" causes the "common mode radiation". The "normal mode current" and the "common mode current" are high frequency currents which cause the electromagnetic interference. The "normal mode current" on the printed board means paired currents with the same quantity, which flow through a signal wiring and a ground plane respectively and in opposite directions to each other or in anti-parallel directions to each other. For example, the first one of the paired currents flows through the signal wiring in a first direction, and the second one of the paired currents flows through the ground plane in a second direction opposite to or anti-parallel to the first direction. The "normal mode current" may also be so called to as "loop current".

FIG. 3 is a schematic perspective view of explaining the normal mode current and the common mode current. The normal mode current is represented by a broken line. The common mode current is represented by a real line. First and second large scale integrated circuits LSI1 and LSI2 have a upper level than a ground plane. The first and second large scale integrated circuits LSI1 and LSI2 are inter-connected to each other through a horizontally extending signal wiring or interconnection which has the particular level upper than the ground plane. Each of the first and second large scale integrated circuits LSI1 and LSI2 is also connected to the ground plane through a vertically extending signal wiring or interconnection.

The normal mode current flows from the first large scale integrated circuit LSI1 through the horizontally extending signal wiring to the second large scale integrated circuit LSI2. Further, the normal mode current flows from the second large scale integrated circuit LSI2 through the vertically extending signal wiring to the ground plane. The normal mode current flows through the ground plane in a direction opposite to or anti-parallel to the direction along which the normal mode current flows through the horizontally extending signal wiring which inter-connects the first and second large scale integrated circuits LSI1 and [LSI2. The normal mode current further flows through the vertically extending signal wiring to the first large scale integrated circuit LSI1. As a result, the normal mode current flows so as to draw a loop in a vertical plane which is defined between the ground plane and the horizontally extending signal wiring different in level from the ground plane.

The common mode current flows in the ground plane. The common mode current is a differential current between a first part of the normal mode current flowing through the horizontally extending signal wiring and a second part of the normal mode current flowing through the ground plane, when the first anti second parts of the normal mode current are made different in quantity from each other by a certain cause. If a balance in current quantity is kept between the first and second parts of the normal mode current, then any differential current or common mode current does not flow. If the balance is lost by any cause, then the differential current or common mode current flows through the ground plane.

The normal mode current flows the looped or closed circuit. The common mode current flows through the two-dimensional space provided by the ground plane and may flow through a cable which is connected to the ground plane.

A distance between the horizontally extending signal wiring and the ground plane is so short that electromagnetic fields generated by the first and second parts of the normal mode current cancel each other, wherein the first and second parts of the normal mode current are opposite in phase to each other and have the same current quantity. If the current quantity of the normal mode current is small, a generated electromagnetic interference may be so small as being ignorable.

The common mode current, however, does not draw such a narrow loop that different parts of the common mode current cancel electromagnetic fields generated by the opposite parts. The common mode current is not limited in current path and is free to flow on two-dimensional space provided by the ground plane, for which reason the common mode current is likely to draw a wide loop which allows a certain or strong electromagnetic radiation.

It is relatively easy to have an accurate grasp of the normal mode current as flowing through the limited one-dimensional space provided by the signal wiring or inter-connection. In contrast, the accurate cause for generating the common mode current has been unclear yet. The common mode current is extremely smaller in current quantity than the normal mode current. This makes it difficult to have an accurate grasp of a current path of the common mode current. For example, it was the conventional common sense that the normal mode radiation or the differential mode radiation may easily be suppressed by the design and layout of the product, but it is difficult to suppress the common mode radiation, for which reason the electromagnetic interference property of the product depends mainly on the common mode radiation.

Any effective design measure for suppressing the common mode current or the common mode radiation had not been developed before the present invention was invented by the present inventors.

In the above circumstances, the development of a novel free from the above problems is desirable.

SUMMARY OF THE INVENTION

Accordingly, it is an object of the present invention to provide a novel design support system for designing a printed board free from the above problems.

It is a further object of the present invention to provide a novel design support system for designing a printed board which is adopted to suppress a common mode radiation and a common mode current.

It is a still further object of the present invention to provide a novel method of designing a printed board free from the above problems.

It is yet a further object of the present invention to provide a novel method of designing a printed board which is adopted to suppress a common mode radiation and a common mode current.

It is further more object of the present invention to provide a novel computer program implemented for designing a printed board free from the above problems.

It is more over object of the present invention to provide a novel computer program implemented for designing a printed board which is adopted to suppress a common mode radiation and a common mode current.

The present invention provides a design support system including a basic functional block for designing a printed board including at least a ground layer; and a first additional functional block for finding at least one resonant frequency to the ground layer based on an information of a resonance-significant size of the ground layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
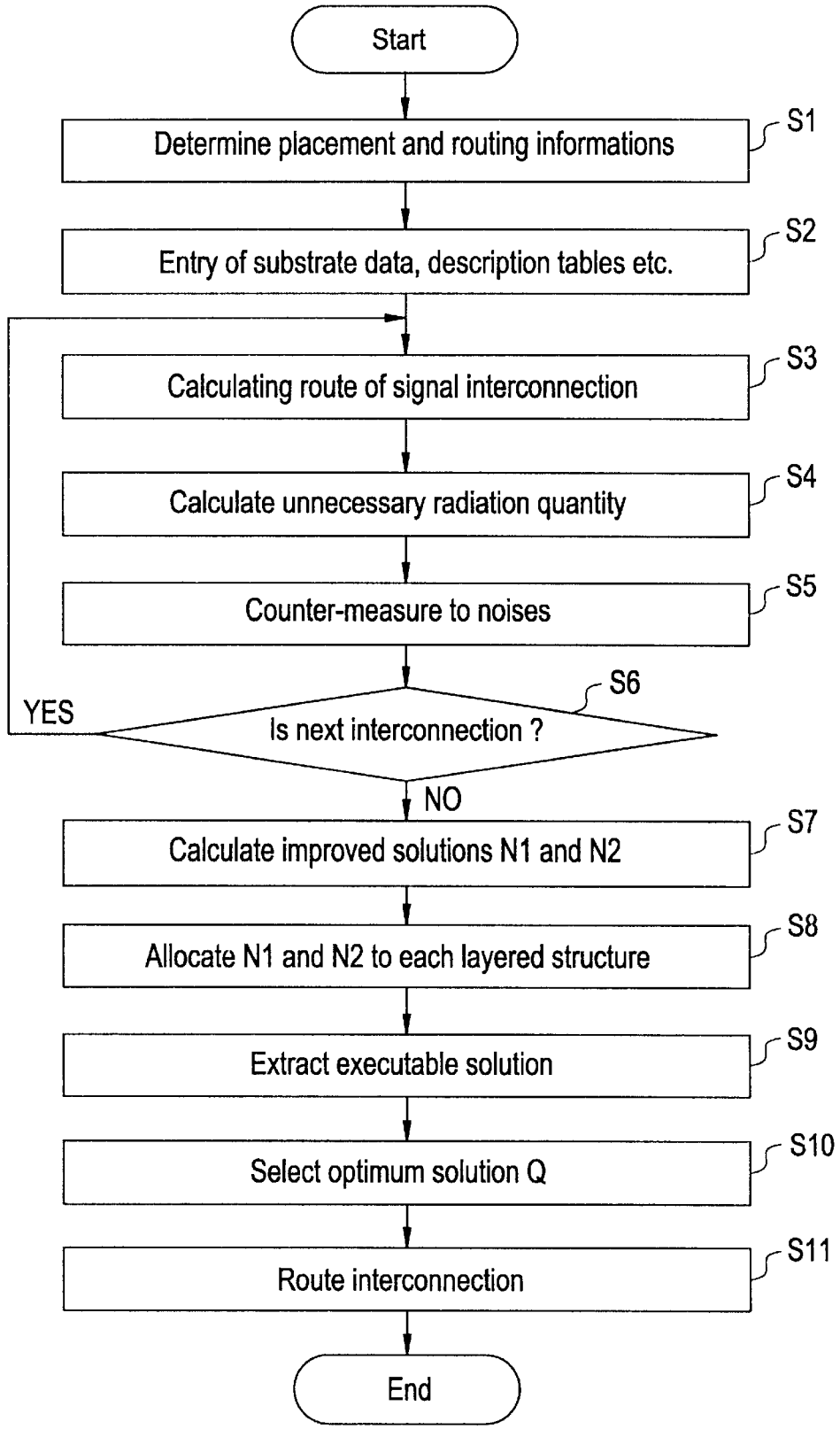
FIG. 1 is a flow chart of respective steps involved in a conventional layout method for the printed board.
Figure 2:
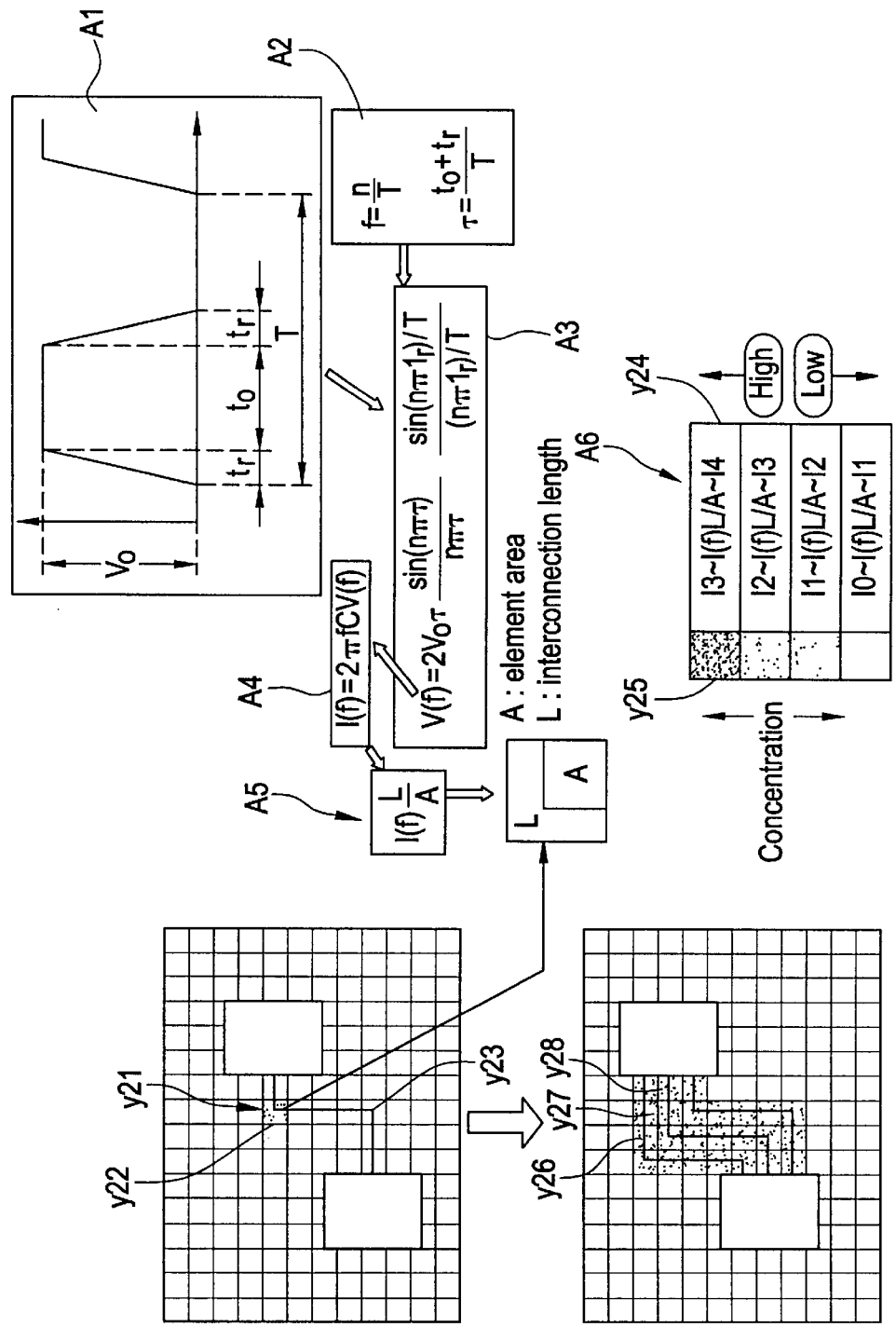
FIG. 2 is a schematic view explaining operations of the conventional printed board CAD system.
Figure 3:
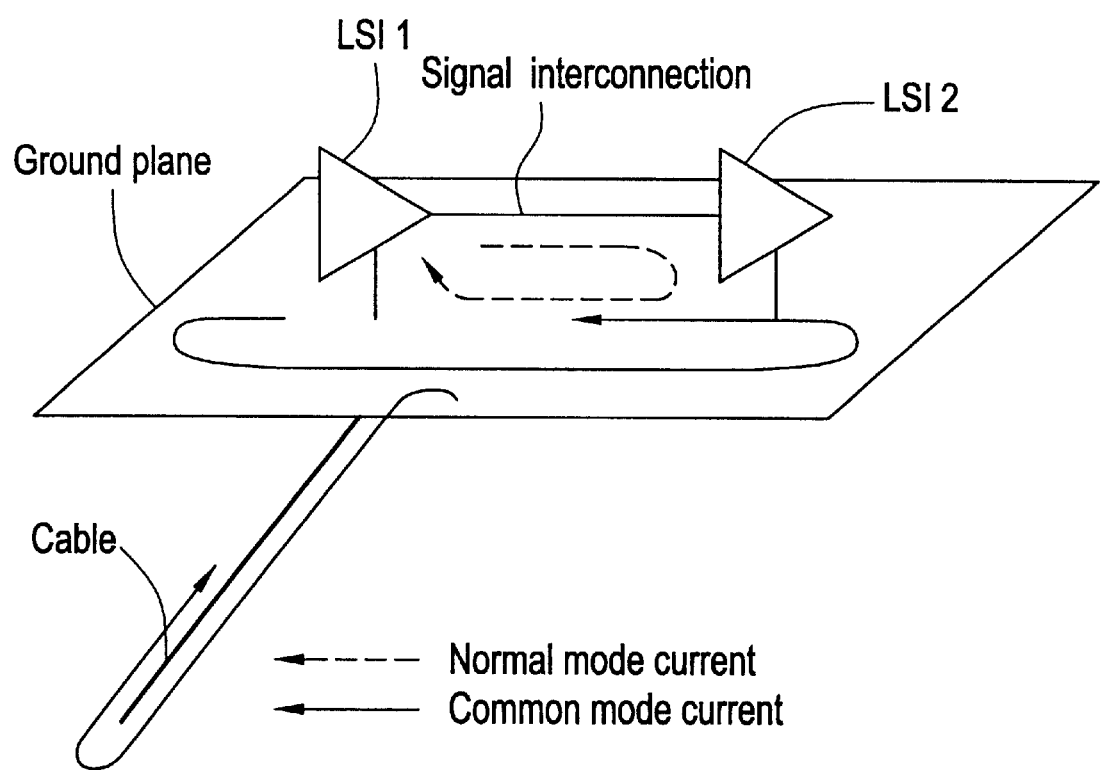
FIG. 3 is a schematic perspective view of explaining the normal mode current and the common mode current.

A first aspect of the present invention is a design support system including: a basic functional block for designing a printed board including at least a ground layer; and a first additional functional block for finding at least one resonant frequency to the ground layer based on an information of a resonance-significant size of the ground layer.

It is preferable that the first additional functional block calculates the at least one resonant frequency on the basis that the resonance-significant size is substantially equal to a product of an integer number and a half-wavelength of the at least one resonant frequency.

It is also preferable that the first additional functional block calculates the at least one resonant frequency on the basis that a product of the resonance-significant size and a constant, which is predetermined depending on the ground layer, is substantially equal to a product of an integer number and a half-wavelength of the at least one resonant frequency. It is further preferable that the constant is larger than 1.

It is also preferable that the resonance-significant size is a length of the ground layer in a longitudinal direction. It is further preferable that the ground layer is a rectangle shape, and the resonance-significant size is either one of long and short sides lengths of the ground layer.

It is also preferable that the first additional functional block is connected to the basic functional block for directly fetching the information of the resonance-significant size of the ground layer from the basic functional block.

It is preferable to further include a second additional functional block connected to the first additional functional block for receiving the resonant frequency from the first additional functional block and for verifying whether the resonant frequency is within an allowable frequency range predetermined in accordance with an electromagnetic interference regulation.

It is also preferable that the first additional functional block further verifies whether the resonant frequency is within an allowable frequency range predetermined in accordance with an electromagnetic interference regulation.

It is also preferable that the ground layer comprises a ground plane.

A second aspect of the present invention is a design support system including: a basic functional block for designing a printed board including at least a ground layer; a first additional functional block for provisional placement of elements over the printed board; a second additional functional block for provisional routing of interconnections between the elements; and a third additional functional block for replacement of the elements interconnected to each other through the interconnections, so as to reduce a total length of the interconnections in a resonance-significant direction of a ground layer of the printed board.

It is preferable that the resonance-significant direction is a longitudinal direction of the ground layer. It is further preferable that the ground layer is a rectangle shape, and the longitudinal direction is parallel to long sides of the ground layer.

It is also preferable that the re-placement of the elements is made to minimize the total length of the interconnections in the resonance-significant direction.

It is also preferable that the re-placement of the elements is made to change extending directions of the interconnections, so as to reduce the total length of the interconnections in the resonance-significant direction. It is further preferable that the re-placement of the elements is made to minimize the total length of the interconnections in the resonance-significant direction.

It is also preferable that the ground layer comprises a ground plane.

It is also preferable that the provisional routing of the interconnections is made so as to take a shortest route of the interconnections.

A third aspect of the present invention is a design support system including: a basic functional block for designing a printed board including at least a ground layer; a first additional functional block for recognizing at least a longitudinal side region adjacent to at least along side of the ground layer; and a second additional functional block for routing at least a designated interconnection between elements placed over the printed board, so as to reduce a total length, in a longitudinal direction of the ground layer, of the interconnection extending on the at least longitudinal side region.

It is preferable that routing the interconnections is made so as to minimize the total length, in the longitudinal direction, of the interconnections extending on the at least longitudinal side region.

It is also preferable that the ground layer is rectangle-shaped, and the at least longitudinal side region includes a pair of stripe-shaped longitudinal side regions along paired long sides of the ground layer.

A fourth aspect of the present invention is a design support system including: a basic functional block for designing a printed board including at least a ground layer; a first additional functional block for recognizing at least a longitudinal side region adjacent to at least a long side of the ground layer; and a second additional functional block for both finding a first total length, in a longitudinal direction of the ground layer, of an entirety of at least a designated interconnection between elements placed over the printed board, and finding a second total length, in the longitudinal direction, of the interconnection extending on the at least longitudinal side region.

It is also preferable to further comprise: a third additional functional block for verifying whether a ratio of the second total length to the first total length is within a predetermined allowable range. It is preferable that furthermore comprise: a fourth additional functional block for re-routing the interconnection, so as to reduce the ratio of the second total length to the first tote length, if the ratio of the second total length to the first total length exceeds the predetermined allowable range. It is moreover preferable that re-routing the interconnection is, made so as to minimize the ratio of the second total length to the first total length.

It is also preferable to further comprise: a fourth additional functional block for re-routing the interconnection, so as to reduce the ratio of the second total length to the first total length. It is moreover preferable that re-routing the interconnection is made so as to minimize the ratio of the second total length to the first total length.

It is also preferable that the ground layer is rectangle-shaped, and the at least longitudinal side region includes a pair of stripe-shaped longitudinal side regions along paired long sides of the ground layer.

A fifth aspect of the present invention is a design support system including a basic functional block for designing a printed board including at least a ground layer; a first additional functional block for recognizing at least a longitudinal side region adjacent to at least a long side of the ground layer; and a second additional functional block for both finding a first total length, in a longitudinal direction of the ground layer, of an entirety of at least a designated interconnection between elements placed over the printed board, and finding a third total length, in the longitudinal direction, of the interconnection extending on a center region other than the at least longitudinal side region.

It is also preferable to further comprise: a third additional functional block for verifying whether a ratio of the third total length to the first total length is within a predetermined allowable range. It is further preferable that further comprise: a fourth additional functional block for re-routing the interconnection, so as to increase the ratio of the third total length to the first total length, if the ratio of the third total length to the first total length exceeds the predetermined allowable range. It is moreover preferable that re-routing the interconnection is made so as to maximize the ratio of the third total length to the first total length.

It is also preferable to further comprise: a fourth additional functional block for re-routing the interconnection, so as to increase the ratio of the third total length to the first total length. It is further preferable that re-routing the interconnection is made so as to maximize the ratio of the third total length to the first total length.

It is also preferable that the ground layer is rectangle-shaped, and the at least longitudinal side region includes a pair of stripe-shaped longitudinal side regions along paired long sides of the ground layer.

A sixth aspect of the present invention is a method of designing a printed board having at least one ground layer The method includes the steps of: finding at least a resonance-significant size of the ground layer; and calculating at least one resonant frequency to the ground layer based on an information of the resonance-significant size of the ground layer.

It is preferable that the at least one resonant frequency is calculated on the basis that the resonance-significant size is substantially equal to a product of an integer number and a half-wavelength of the at least one resonant frequency.

It is also preferable that the at least one resonant frequency is calculated on the basis that a product of the resonance-significant size and a constant, which is predetermined depending on the ground layer, is substantially equal to a product of an integer number and a half-wavelength of the at least one resonant frequency. It is further preferable that the constant is larger than 1.

It is also preferable that the resonance-significant size is a length of the ground layer in a longitudinal direction. It is further preferable that the ground layer is a rectangle shape, and the resonance-significant size is either one of long and short sides lengths of the ground layer.

It is also preferable to further include the step of: verifying whether the resonant frequency is within an allowable frequency range predetermined in accordance with an electromagnetic interference regulation.

It is also preferable that the ground layer comprises a ground plane.

A seventh aspect of the present invention is a method of designing a printed board having at least one ground layer.

The method includes the steps of: executing a provisional placement of elements over the printed board; executing a provisional routing of interconnections between the elements; and executing a re-placement of the elements interconnected to each other through the interconnections, so as to reduce a total length of the interconnections in a resonance-significant direction of a ground layer of the printed board.

It is preferable that the resonance-significant direction is a longitudinal direction of the ground layer. It is further preferable that the ground layer is a rectangle shape, and the longitudinal direction is parallel to long sides of the ground layer.

It is also preferable that the re-placement of the elements is made to minimize the total length of the interconnections in the resonance-significant direction.

It is also preferable that the re-placement of the elements is made to change extending directions of the interconnections, so as to reduce the total length of the interconnections in the resonance-significant direction. It is further preferable that the re-placement of the elements is made to minimize the total length of the interconnections in the resonance-significant direction.

It is also preferable that the ground layer comprises a ground plane.

It is also preferable that the provisional routing of the interconnections is made so as to take a shortest route of the interconnections.

An eighth aspect of the present invention is a method of designing a printed board having at least one ground layer. The method includes the steps of: recognizing at least a longitudinal side region adjacent to at least a long side of the ground layer; and routing at least a designated interconnection between elements placed over the printed board, so as to reduce a total length, in a longitudinal direction of the ground layer, of the interconnection extending on the at least longitudinal side region.

It is preferable that routing the interconnections is made so as to minimize the total length, in the longitudinal direction, of the interconnections extending on the at least longitudinal side region.

It is also preferable that the ground layer is rectangle-shaped, and the at least longitudinal side region includes a pair of stripe-shaped longitudinal side regions along paired long sides of the ground layer.

A ninth aspect of the present invention is a method of designing a printed board having at least one ground layer. The method includes the steps of: recognizing at least a longitudinal side region adjacent to at least a long side of the ground layer, and finding a first total length, in a longitudinal direction of the ground layer, of an entirety of at least a designated interconnection between elements placed over the printed board, and finding a second total length, in the longitudinal direction, of the interconnection extending on the at least longitudinal side region.

It is preferable to further comprise the step of: verifying whether a ratio of the second total length to the first total length is within a predetermined allowable range. It is further preferable to furthermore comprise the step of: re-routing the interconnection, so as to reduce the ratio of the second total length to the first total length, if the ratio of the second total length to the first total length exceeds the predetermined allowable range. It is moreover preferable that re-routing the interconnection is made so as to minimize the ratio of the second total length to the first total length.

It is also preferable to further comprise the step of: re-routing the interconnection, so as to reduce the ratio of the second total length to the first total length. It is further preferable that re-routing the interconnection is made so as to minimize the ratio of the second total length to the first total length.

It is also preferable that the ground layer is rectangle-shaped, and the at least longitudinal side region includes a pair of stripe-shaped longitudinal side regions along paired long sides of the ground layer.

A tenth aspect of the present invention is a method of designing a printed board having at least one ground layer. The method includes the steps of: recognizing at least a longitudinal side region adjacent to at least a long side of the ground layer; and finding a first total length, in a longitudinal direction of the ground layer, of an entirety of at least a designated interconnection between elements placed over the printed board, and finding a third total length, in the longitudinal direction, of the interconnection extending on a center region other than the at least longitudinal side region.

It is preferable to further comprise the step of: verifying whether a ratio of the third total length to the first total length is within a predetermined allowable range. It is further preferable to furthermore comprise the step of: re-routing the interconnection, so as to increase the ratio of the third total length to the first total length, if the ratio of the third total length to the first total length exceeds the predetermined allowable range. It is further preferable that re-routing the interconnection is made so as to maximize the ratio of the third total length to the first total length.

It is also preferable to further comprise the step of: re-routing the interconnection, so as to increase the ratio of the third total length to the first total length. It is further preferable that re-routing the interconnection is made so as to maximize the ratio of the third total length to the first total length.

It is also preferable that the ground layer is rectangle-shaped, and the at least longitudinal side region includes a pair of stripe-shaped longitudinal side regions along paired long sides of the ground layer.

An eleventh aspect of the present invention is a computer program for designing a printed hoard having at least one ground layer. The computer program includes the steps of: finding at least a resonance-significant size of the ground layer; and calculating at least one resonant frequency to the ground layer based on an information of the resonance-significant size of the ground layer.

It is preferable that the at least one resonant frequency is calculated on the basis that the resonance-significant size is substantially equal to a product of an integer number and a half-wavelength of the at least one resonant frequency.

It is also preferable that the at least one resonant frequency is calculated on the basis that a product of the resonance-significant size and a constant, which is predetermined depending on the ground layer, is substantially equal to a product of an integer number and a half-wavelength of the at least one resonant frequency. It is further preferable that the constant is larger than 1.

It is also preferable that the resonance-significant size is a length of the ground layer in a longitudinal direction. It is further preferable that the ground layer is a rectangle shape, and the resonance-significant size is either one of long and short sides lengths of the ground layer.

It is also preferable to further include the step of: verifying whether the resonant frequency is within an allowable frequency range predetermined in accordance with an electromagnetic interference regulation.

It is also preferable that the ground layer comprises a ground plane.

A twelfth aspect of the present invention is a computer program of designing a printed board having at least one ground layer. The computer program includes the steps of: executing a provisional placement of elements over the printed board; executing a provisional routing of interconnections between the elements; and executing a re-placement of the elements interconnected to each other through the interconnections, so as to reduce a total length of the interconnections in a resonance-significant direction of a ground layer of the printed board.

It is preferable that the resonance-significant direction is a longitudinal direction of the ground layer. It is further preferable that the ground layer is a rectangle shape, and the longitudinal direction is parallel to long sides of the ground layer.

It is also preferable that the re-placement of the elements is made to minimize the total length of the interconnections in the resonance-significant direction.

It is also preferable that the re-placement of the elements is made to change extending directions of the interconnections, so as to reduce the total length of the interconnections in the resonance-significant direction. It is further preferable that the re-placement of the elements is made to minimize the total length of the interconnections in the resonance-significant direction.

It is also preferable that the ground layer comprises a ground plane.

It is also preferable that the provisional routing of the interconnections is made so as to take a shortest route of the interconnections.

A thirteenth aspect of the present invention is a computer program of designing a printed board having at least one ground layer. The computer program includes the steps of: recognizing at least a longitudinal side region adjacent to at least a long side of the ground layer; and routing at least a designated interconnection between elements placed over the printed board, so as to reduce a total length, in a longitudinal direction of the ground layer, of the interconnection extending on the at least longitudinal side region.

It is preferable that routing the interconnections is made so as to minimize the total length, in the longitudinal direction, of the interconnections extending on the at least longitudinal side region.

It is also preferable that the ground layer is rectangle-shaped, and the at least longitudinal side region includes a pair of stripe-shaped longitudinal side regions along paired long sides of the ground layer.

A fourteenth aspect of the present invention is a computer program of designing a printed board having at least one ground layer. The computer program including the steps of: recognizing at least a longitudinal side region adjacent to at least a long side of the ground layer; and finding a first total length, in a longitudinal direction of the ground layer, of an entirety of at least a designated interconnection between elements placed over the printed board, and finding a second total length, in the longitudinal direction, of the interconnection extending on the at least longitudinal side region.

It is preferable to further comprise the step of: verifying whether a ratio of the second total length to the first total length is within a predetermined allowable range. It is further preferable that furthermore comprise the step of: re-routing the interconnection, so as to reduce the ratio of the second total length to the first total length, if the ratio of the second total length to the first total length exceeds the predetermined allowable range. It is moreover preferable that re-routing the interconnection is made so as to minimize the ratio of the second total length to the first total length.

It is also preferable to further comprise the step of: re-routing the interconnection, so as to reduce the ratio of the second total length to the first total length. It is further preferable that re-routing the interconnection is made so as to minimize the ratio of the second total length to the first total length.

It is also preferable that the ground layer is rectangle-shaped, and the at least longitudinal side region includes a pair of stripe-shaped longitudinal side regions along paired long sides of the ground layer.

A fifteenth aspect of the present invention is a computer program of designing a printed board having at least one ground layer. The computer program includes the steps of: recognizing at least a longitudinal side region adjacent to at least a long side of the ground layer; and finding a first total length, in a longitudinal direction of the ground layer, of an entirety of at least a designated interconnection between elements placed over the printed board, and finding a third total length, in the longitudinal direction, of the interconnection extending on a center region other than the at least longitudinal side region.

It is preferable to further comprise the step of: verifying whether a ratio of the third total length to the first total length is within a predetermined allowable range. It is further preferable that furthermore comprise the step of: re-routing the interconnection, so as to increase the ratio of the third total length to the first total length, if the ratio of the third total length to the first total length exceeds the predetermined allowable range. It is moreover preferable that re-routing the interconnection is made so as to maximize the ratio of the third total length to the first total length.

It is also preferable to further comprise the step of: re-routing the interconnection, so as to increase the ratio of the third total length to the first total length. It is further preferable that re-routing the interconnection is made so as to maximize the ratio of the third total length to the first total length.

It is also preferable that the ground layer is rectangle-shaped, and the at least longitudinal side region includes a pair of stripe-shaped longitudinal side regions along paired long sides of the ground layer.

FIRST EMBODIMENT

A first embodiment according to the present invention will be described in detail with reference to the drawings. The present invention provides a design support system for designing a printed board adjusted to suppress not only a normal mode radiation but also a common mode radiation for the purpose of suppressing the electromagnetic interference.

The design support system has a basic function for designing a printed board and a novel design function for realizing the suppression of not only the normal mode radiation but also the common mode radiation for the purpose of suppressing the electromagnetic interference.

The design support system may be realized by any available information processing systems such as work stations, personal computers and any other computer systems with software. It is unnecessary to limit the kinds of the hard ware for realizing the design support system.

In this embodiment, the design support system has the basic function for designing the printed board. The design support system further includes a first functional block for finding respective lengths of respective sides of a ground plane of a subject printed board from a layout information of the subject printed board. This ground plane may correspond to a ground plane.

The design support system further includes a second functional block connected to the first functional block for receiving the respective lengths of the respective sides of the ground plane and finding respective frequencies having respective half-wavelengths which are substantially equal to or smaller by any integer number times than either one of the respective lengths of the respective sides of the ground plane, provided that the respective frequencies are within an allowable range predetermined in accordance with a predetermined electromagnetic interference regulation.

The design support system further includes a third functional block connected to the second functional block for receiving the particular frequency founded by the second functional block and displaying the frequency.

Figure 4:
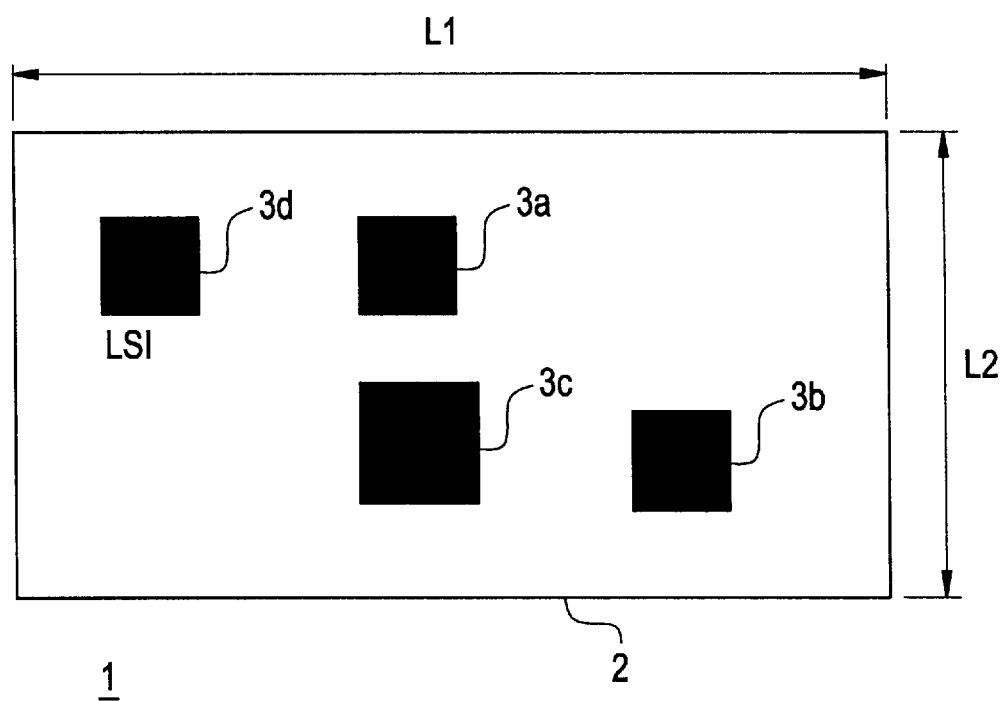
FIG. 4 is a plan view of a ground plane of a printed board and a layout of devices, for example, plural LSIs by use of a design support system of the first embodiment in accordance with the present invention.

FIG. 4 is a plan view of a ground plane of a printed board and a layout of devices, for example, plural LSIs by use of a design support system of a first embodiment in accordance with the present invention. A rectangle shaped printed board 1 is a subject printed board to be designed by the design support system. The printed board 1 has a ground plane 2 which also has a rectangle shape. Four LSIs 3a, 3b 3c and 3d are placed over the printed board 1.

The first functional block of the design support system fetches informations associated with the ground plane 2 from the layout information of the printed board 1. The first functional block finds respective lengths L1 and L2 of long and short sides of the ground plane 2.

The second functional block of the design support system receives the respective lengths L1 and L2 of long and short sides of the ground plane 2 from the first functional block of the design support system. The second functional block finds respective frequencies having respective half-wavelengths which are substantially equal to or smaller by any integer number times than either one of the lengths L1 and L2. The second functional block further verifies that the respective frequencies founded are within an allowable range predetermined in accordance with a predetermined electromagnetic interference regulation.

A relationship between the frequency and the wavelength is given by Frequency (Hz)=[3×10E+8(m/s)]/wavelength (m)]. The frequency fr is further given by:

$$fr=(300\times10^6)/(2L)$$

where (3×10E+8) is a propagation speed or velocity of electromagnetic wave in vacuum.

If the half-wavelength of the frequency is substantially equal to or smaller by any integer number times than either one of the lengths L1 and L2, then the frequency is a resonant frequency to the ground plane 2 of the printed board 1. For example, any one of a half-wavelength, a one-wavelength, a one-and-half-wavelength, a double-wavelength, a two-and-half-wavelength, a triple-wavelength of the frequency is substantially equal to either one of the lengths L1 and L2 of the ground plane 2, then the frequency is the resonant frequency. If the frequency is the resonant frequency to the ground plane 2, a common mode radiation from the printed board 1 is emphasized.

The designer may have an accurate grasp of the resonant frequency of the ground plane 2, which may emphasize the common mode radiation. In order to avoid the emphasis of the common mode radiation from the printed board 1, the designer may avoid to use the resonant frequency in designing the printed board 1. Alternatively, the designer may take an effective counter-measure to the common mode radiation. In any event, the above second functional block of the design support system informs the designer of the frequencies that may emphasize the common mode radiation from the printed board 1.

Figure 5A:
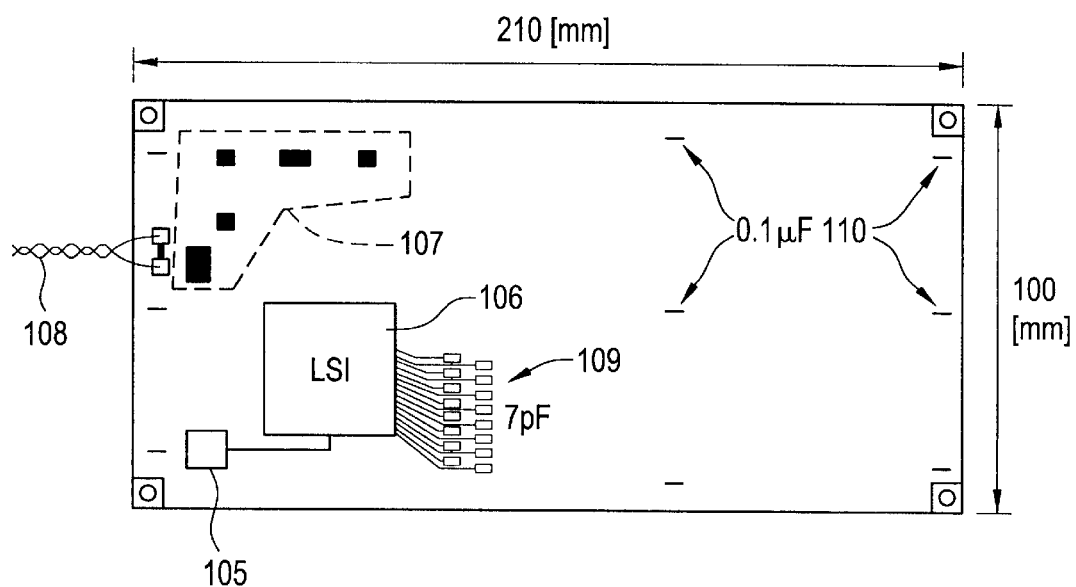
FIG. 5A is a plan view of a printed board as one example to be designed by the design support system.
Figure 5B:
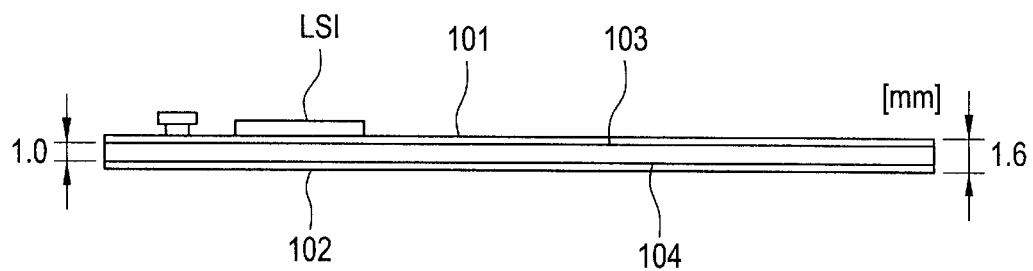
FIG. 5B is a cross sectional view of the printed board of FIG. 5A.

FIG. 5A is a plan view of a printed board as one example to be designed by the design support system. FIG. 5B is a cross sectional view of the printed board of FIG. 5A. The following description is directed to a relationship of the lengths of the respective sides of the ground plane, the frequencies and the common mode radiation from the printed board, and also to the reason why the frequency having a half-wavelength which is substantially equal to the length of the printed board may emphasize the common mode radiation from the printed board 1.

The printed board has a long side length of 210 millimeters, and a short side length of 100 millimeters and a thickness of 1.6 millimeters. The printed board include four layers, for example, a first signal layer 101, a ground plane 103 underlying the first signal layer 101, a power plane 104 underlying the ground plane 103, a second signal layer 102 underlying the power plane 104. The ground plane 103 and the power plane 104 are isolated by an inter-layer insulator and distanced from each other by 1.0 millimeter.

The following circuit elements or devices are placed over the first signal layer 101 of the printed board 1. A quartz oscillator 105 of 40 MHz is placed over the first signal layer 101. A large scale integrated circuit 106 having a field programmable gate array is also placed over the first signal layer 101. The large scale integrated circuit 106 is connected to the quartz oscillator 105. Sixteen load capacitances 109 of 7 pF ale placed over the first signal layer 101. The load capacitances 109 are connected to the large scale integrated circuit 106. A de-coupling capacitor of 0.1 micro-F F is placed over the first signal layer 101. An initialization circuit 107 is placed over the first signal layer 101. A power cable 108 is connected to power terminals of the printed board.

The quartz oscillator 105 generates a rectangle-wave signal with a frequency of 40 MHz. The rectangle-wave signal is then transmitted to the large scale integrated circuit 106. The large scale integrated circuit 106 outputs a rectangle-wave signal with a frequency of 20 MHz. The rectangle-wave signal is then transmitted to the sixteen load capacitances 109 of 7 pF. The initialization circuit 107 is provided to decide an operation mode of the large scale integrated circuit 106. Except in the initial time period, the quartz oscillator 105, the large scale integrated circuit 106 and the load capacitances 109 remain activated.

Figure 6:
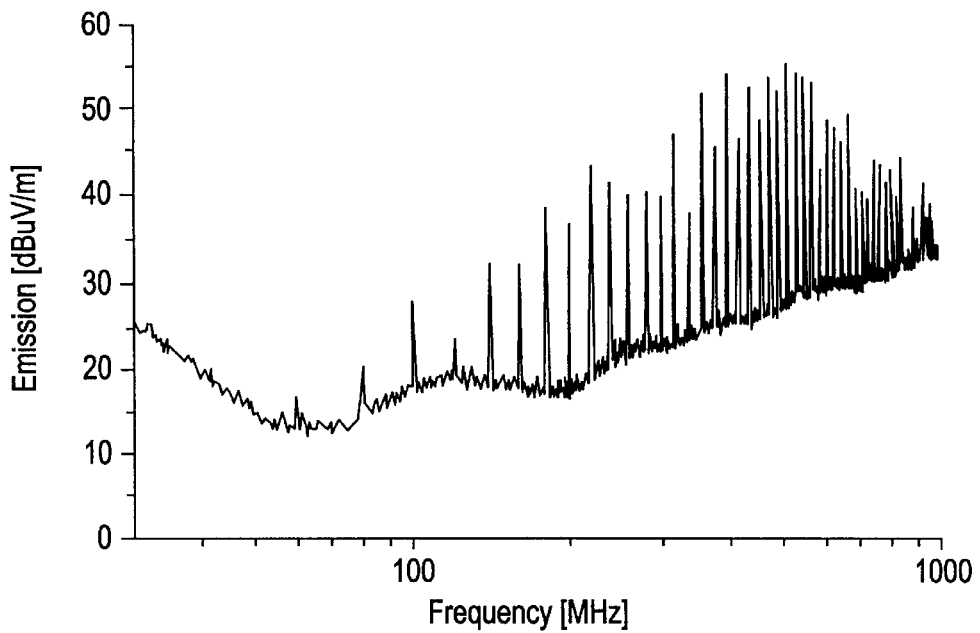
FIG. 6 is a diagram of electromagnetic wave emissions from the printed board over frequency to show a horizontally polarized wave property.
Figure 7:
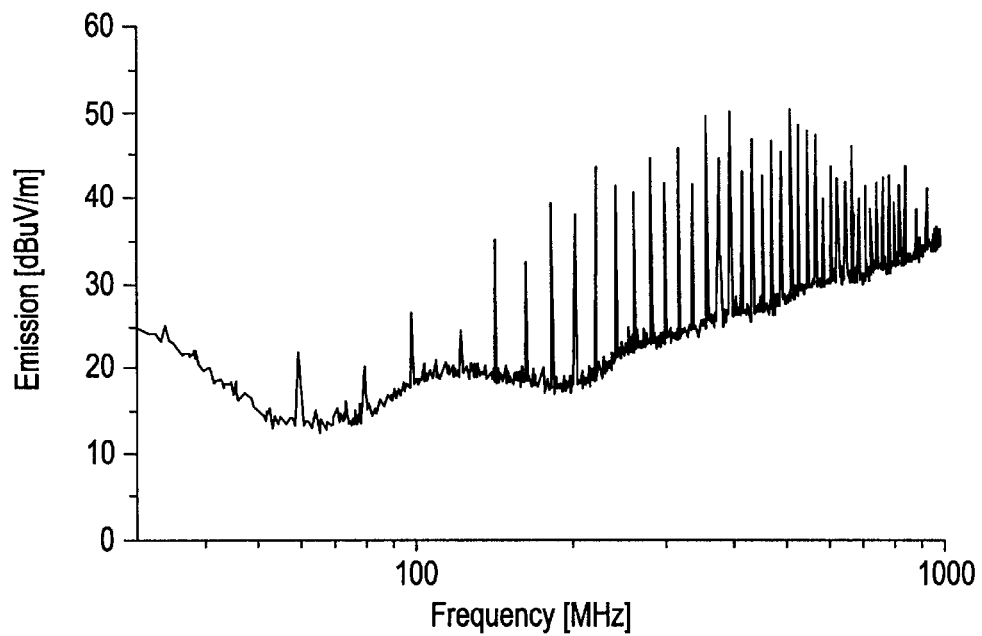
FIG. 7 is a diagram of electromagnetic wave emissions from the printed board over frequency to show a vertically polarized wave property.

FIG. 6 is a diagram of electromagnetic wave emissions from the printed board over frequency to show a horizontally polarized wave property. FIG. 7 is a diagram of electromagnetic wave emissions from the printed board over frequency to show a vertically polarized wave property. The electromagnetic wave emissions from the printed board were measured over a frequency range of 30 MHz to 1 GHz, wherein this frequency range accords to the regulation of measurement of the electromagnetic interference. This measurement was made in a radio wave darkroom with a floor covered by a radio wave absorbent, A measuring antenna was placed to have a distance of 3 meters from the printed board. The printed board and the measuring antenna were set to have a uniform height of 1.5 meters. The printed board was placed in parallel to the floor of the radio wave darkroom.

FIG. 6 shows the horizontally polarized wave property having a radiation level peak in the vicinity of 520 MHz. FIG. 7 shows the vertically polarized wave property having a radiation level peak in the vicinity of 520 MHz. In the frequency range of 300 MHz to 700 MHz, the horizontally polarized wave is higher in radiation level than the vertically polarized wave. In other frequency ranges than 300 MHz to 700 MHz, the difference in radiation level between the horizontally polarized wave and the vertically polarized wave are small.

Figure 8:
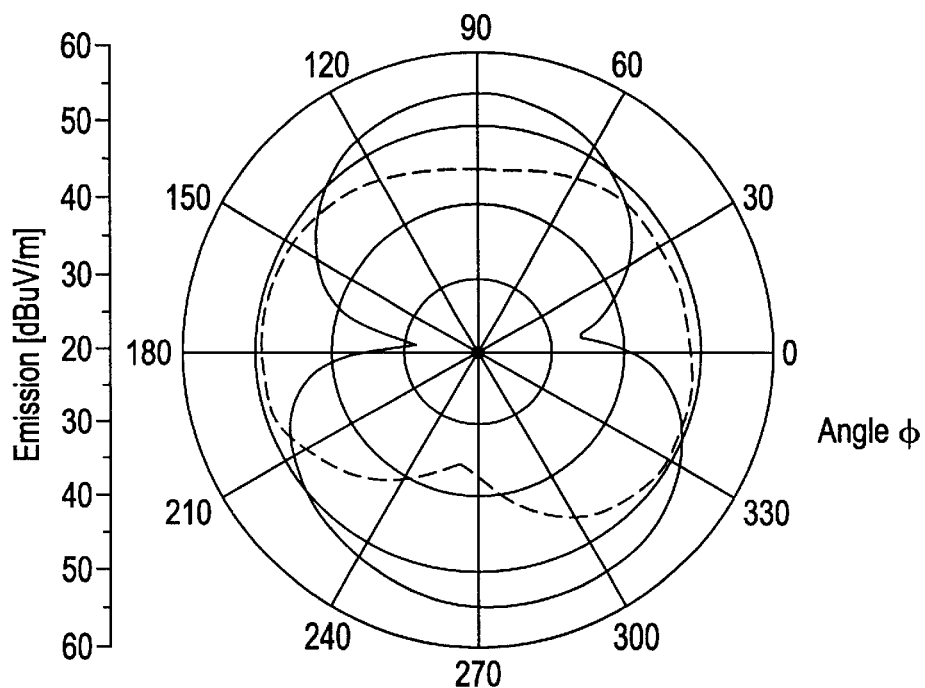
FIG. 8 is a diagram of radiation patterns measured at a frequency of 520 MHz where the radiation level is highest.

Radiation patterns were measured at a frequency of 520 MHz where the radiation level is highest, in order to ascertain the reason why the horizontally polarized wave is higher in radiation level than the vertically polarized wave in the frequency range of 300 MHz to 700 MHz. FIG. 8 is a diagram of radiation patterns measured at a frequency of 520 MHz where the radiation level is highest. A real line represents the horizontally polarized wave. A broken line represents the vertically polarized wave.

The horizontally polarized wave represented by the real line has two peaks in the vicinity of 90 degrees and 270 degrees and two valleys in the vicinity of 0 degree and 180 degrees, so that the horizontally polarized wave has a pattern of partially overlapped dual deformed-circles, such as a 8-character shape. In contrast, the vertically polarized wave represented by the broken line has two peaks in the vicinity of 0 degree and 180 degrees and a single valley in the vicinity of 270 degrees, so that the vertically polarized wave has a pattern of deformed-oval. The horizontally polarized wave is different in radiation pattern from the vertically polarized wave.

Figure 9:
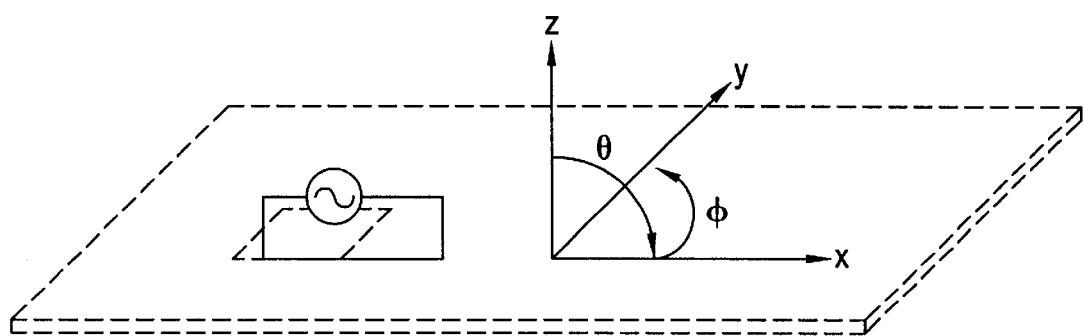
FIG. 9 is a schematic view of a normal mode radiation model.
Figure 10:
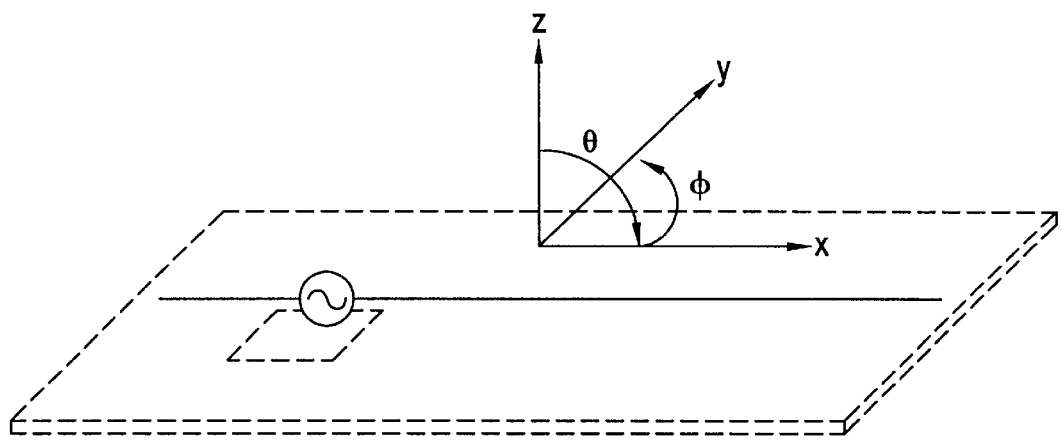
FIG. 10 is a schematic view of a common mode radiation model.

The respective radiation patterns of the horizontally polarized wave and the vertically polarized wave will be described based on respective radiation models shown in FIGS. 9 and 10. FIG. 9 is a schematic view of a normal mode radiation model. FIG. 10 is a schematic view of a common mode radiation model.

In the normal mode radiation model of FIG. 9, a signal wiring, which interconnects between the quartz oscillator and the large scale integrated circuit, or another signal wiring, which interconnects between the load capacitances and the large scale integrated circuit, serve as a microantenna. The vertically polarized wave is the main polarized wave, wherein a loop face corresponds to the receiving face of the antenna. The radiation pattern has two peaks in the vicinity of 0 degree and 180 degrees, so that the radiation pattern has a pattern of partially overlapped dual deformed-circles, such as a 8-character shape. This radiation pattern substantially corresponds to the vertically polarized wave radiation pattern.

In the common mode radiation model of FIG. 10, a longitudinal side of the ground plane serves as a half-wavelength dipole antenna. The horizontally polarized wave is the main polarized wave, wherein a longitudinal direction of the ground plane corresponds to the receiving face of the antenna. The radiation pattern has two peaks in the vicinity of 90 degrees and 270 degrees, so that the radiation pattern has a pattern of partially overlapped dual deformed-circles, such as a 8-character shape. This radiation pattern substantially corresponds to the horizontally polarized wave radiation pattern.

Therefore, it is expectable from the above descriptions that the common mode radiation from the ground plane is the cause that the horizontally polarized wave is higher in radiation level than the vertically polarized wave in the frequency range of 300 MHz to 700 MHz.

Figure 11A:
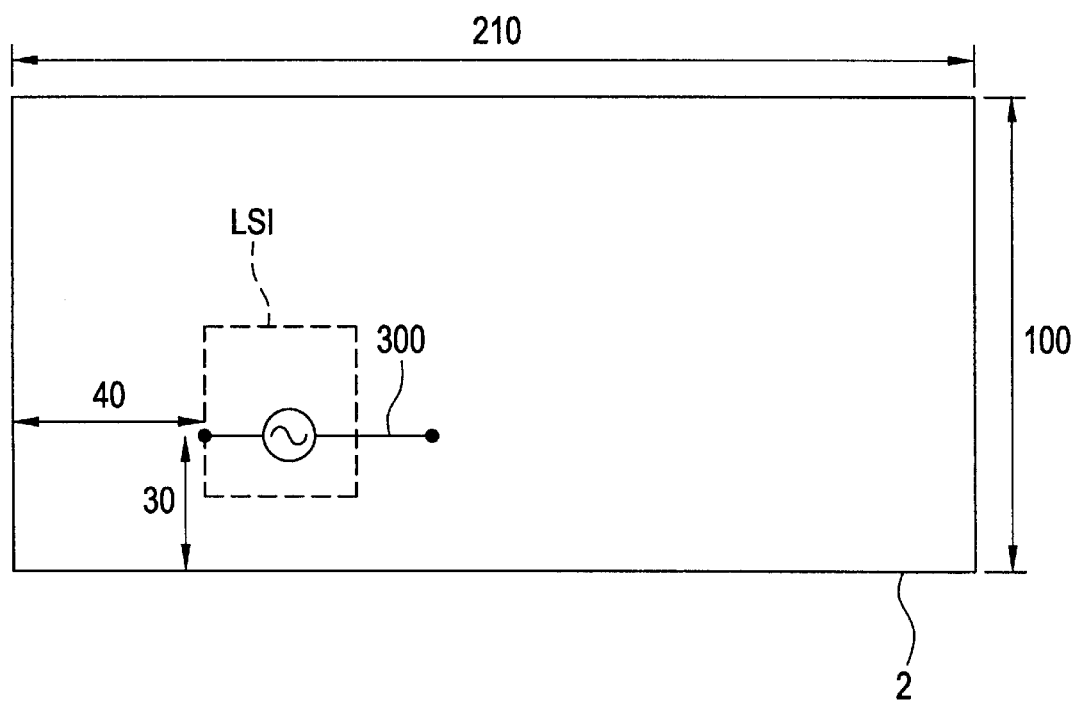
FIG. 11A is a plan view of the electromagnetic analyzing model.
Figure 11B:
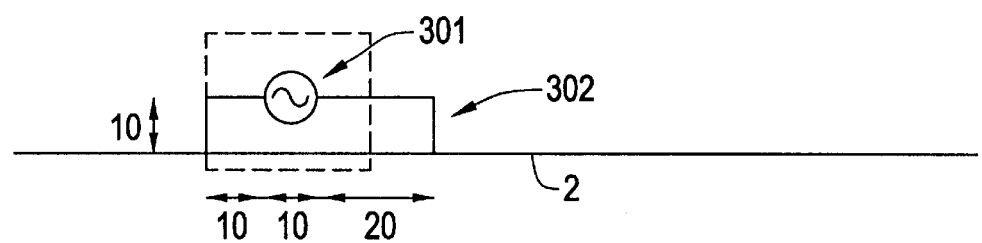
FIG. 11B is a side view of the electromagnetic analyzing model of FIG. 11A.

In order to investigate the above expectation, the radiation pattern is calculated by use of an electromagnetic analyzing model of FIGS. 11A and 11B. FIG. 11A is a plan view of the electromagnetic analyzing model. FIG. 11B is a side view of the electromagnetic analyzing model of FIG. 11A. It was assumed that the large scale integrated circuits are main factors for supplying the common mode current to the ground plane. The chips for the large sale integrated circuits are represented by a power source. The lead frame and the signal wirings of the large scale integrated circuits are represented by a fall conductive wiring. The load capacitor is represented by one-ohm resistance. The ground plane is represented by a full conductive plane. The radiation model of FIGS. 11A and 11B is a combined model of both the normal mode radiation model of FIG. 9 and the common mode radiation model of FIG. 10. An electromagnetic field simulator and a Finite Difference Time Domain method were used to obtain a radiation pattern.

Figure 12:
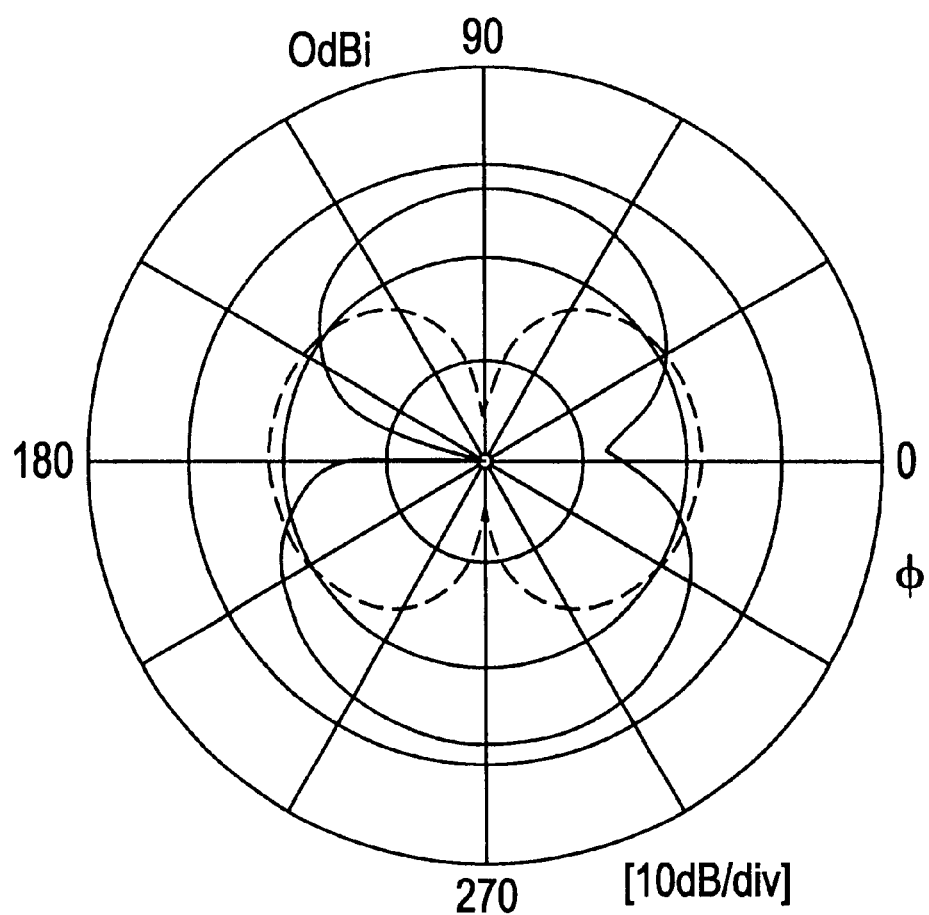
FIG. 12 is a diagram of radiation patterns calculated at 520 MHz for both the horizontally polarized wave and the vertically polarized wave.

FIG. 12 is a diagram of radiation patterns calculated at 520 MHz for both the horizontally polarized wave and the vertically polarized wave. A vertical axis represents an absolute gain which is proportional to the radiation field property. The calculated radiation patterns for both the horizontally polarized wave and the vertically polarized wave of FIG. 12 are similar to the measured radiation patterns of FIG. 8. It was confirmed that the radiation models of FIGS. 9 and 10 are useful. It was also confirmed that the common mode radiation from the ground plane is dominant over the normal mode radiation.

Figure 13:
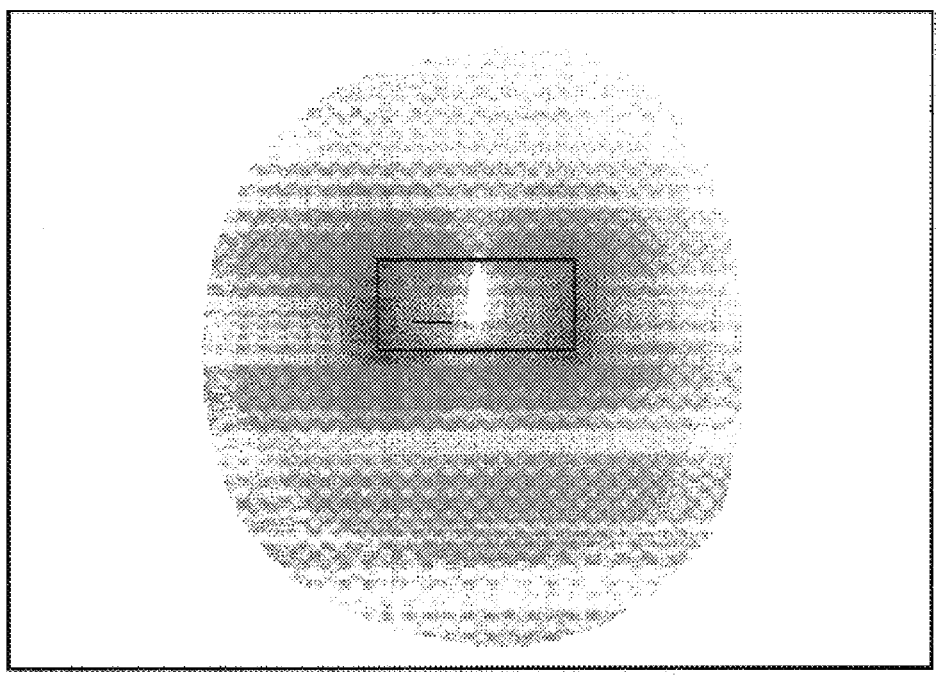
FIG. 13 is a view of a distribution in intensity of the electric field in the vicinity of the ground plane.
Figure 14:
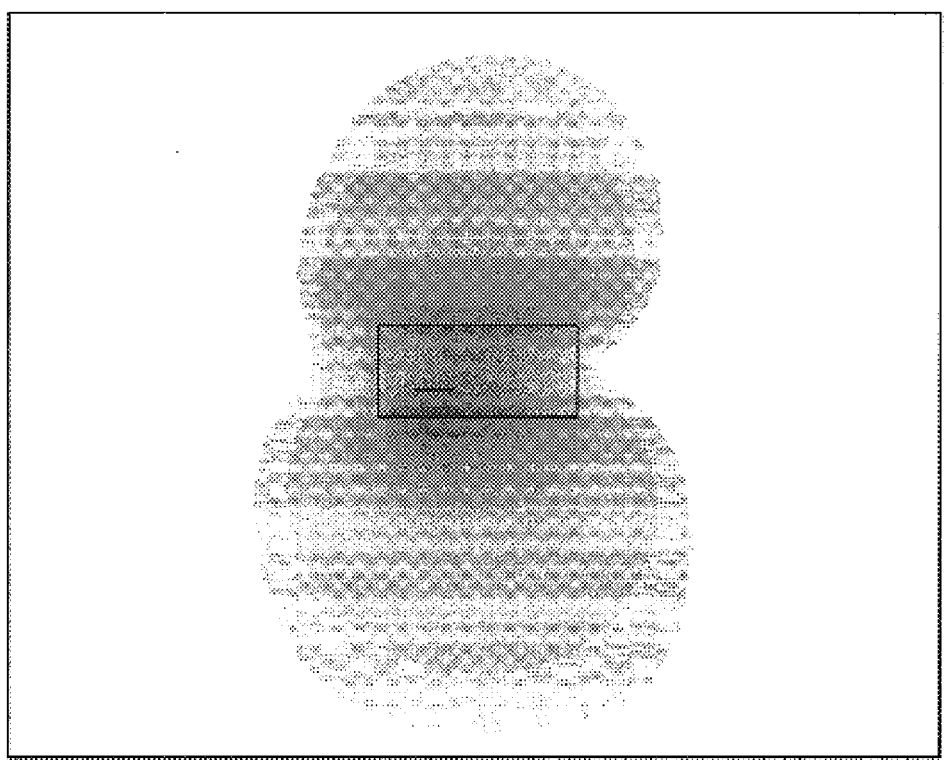
FIG. 14 is a view of a distribution in intensity of the magnetic field in the vicinity of the ground plane.

A distribution in intensity of the electromagnetic field in the vicinity of the ground plane was founded in order to investigate the property of the common mode current over the ground plane. FIG. 13 is a view of a distribution in intensity of the electric field in the vicinity of the ground plane. FIG. 14 is a view of a distribution in intensity of the magnetic field in the vicinity of the ground plane. The electric field and the magnetic field are of the positions distanced from the ground plane by 10 millimeters in the side free of the signal wirings. A square sum of three directional components of the electromagnetic fields was taken. The electric field intensity is high at the edges and low in the center region. In contrast, the electric field intensity is low at the edges and high in the center region. This means that the ground plane serves as the half-wavelength dipole antenna.

A frequency of 714 MHz has a half-wavelength of 210 millimeters which is equal to the long side length of the ground plane. The frequency of 520 MHz, at which the radiation level has the actual peak, is 0.75 times of this frequency of 714 MHz. The ground plane is largely excited and the common mode radiation from the ground plane is emphasized. The frequency, at which the radiation level has the actual peak, is lower by 0.75 times than the frequency which has the half-wavelength substantially equal to the long side length of the ground plane. Namely, 1.3 times of the frequency, at which the radiation level has the actual peak, is equal to the frequency which has the half-wavelength substantially equal to the long side length of the ground plane. The frequency, at which the radiation level has the actual peak, is equal to 0.75 times the frequency which has the half-wavelength substantially equal to the long side length of the ground plane.

It was confirmed from the above results that the common mode radiation becomes intensive in the vicinity of the frequency having the half-wavelength which is nearly equal to the long side length of the ground plane.

If the half-wavelength of the frequency is substantially equal to either one of the long side and short side lengths of the ground plane, then the frequency is a resonant frequency to the ground plane of the printed board, whereby the common mode radiation becomes remarkable. For example, any one of a half-wavelength., a one-wavelength, a one-and-half-wavelength, a double-wavelength, a two-and-half-wavelength, a triple-wavelength of the frequency is substantially equal to either one of the long side and short side lengths of the ground plane, then the frequency is the resonant frequency, whereby a common mode radiation from the printed board is emphasized.

The designer may have an accurate grasp of the resonant frequency of the ground plane, which may emphasize the common mode radiation. In order to avoid the emphasis of the common mode radiation from the printed board, the designer may avoid to use the resonant frequency in designing the printed board. Alternatively, the designer may take an effective counter-measure to the common mode radiation. In any event, the above second functional block of the design support system informs the designer of the frequencies that may emphasize the common mode radiation from the printed board.

In accordance with the present invention of this embodiment, a design support system includes: a basic functional block for designing a printed board including at least a ground layer; and a first additional functional block for finding at least one resonant frequency to the ground layer based on an information of a resonance-significant size of the ground layer.

It is possible that the first additional functional block calculates the at least one resonant frequency on the basis that the resonance-significant size is substantially equal to a product of an integer number and a half-wavelength of the at least one resonant frequency.

It is alternatively possible that the first additional functional block calculates the at least one resonant frequency on the basis that a product of the resonance-significant size and a constant, which is predetermined depending on the ground layer, is substantially equal to a product of an integer number and a half-wavelength of the at least one resonant frequency.

It is possible that the constant is larger than 1.

It is also preferable that the resonance-significant size is a length of the ground layer in a longitudinal direction. It is more preferable that the ground layer is a rectangle shape, and the resonance-significant size is a long side length of the ground layer.

It is also preferable that the first additional functional block is connected to the basic functional block for directly fetching the information of the resonance-significant size of the ground layer from the basic functional block.

It is also preferable to further includes a second additional functional block connected to the first additional functional block for receiving the resonant frequency from the first additional functional block and for verifying whether the resonant frequency is within an allowable frequency range predetermined in accordance with an electromagnetic interference regulation.

It is also preferable that the first additional functional block further verifies whether the resonant frequency is within an allowable frequency range predetermined in accordance with an electromagnetic interference regulation.

It is also preferable that the ground layer comprises a ground plane.

The above novel design support system may be realized by any available measures, for example, a computer readable program, wherein program codes are stored in a computer readable storage medium, so that the computer reads the program codes from the storage medium, and implements the program.

The computer readable storage medium may include any available non-volatile storage mediums, for example, a floppy disk, an optical-magnetic disk, ROM, CD-ROM, and any computer-integrated memory devices such as a hard disk as well as any available volatile storage mediums such as RAM.

The program codes may optionally be transmitted from the memory device of the computer system through a transmission medium to other computer system. The transmission medium may include any available medium for transmission, for example, any networks such as internet, communication lines.

It is possible that a part of the above function blocks is realized by the program codes. Alternatively, a differential file or differential program codes may be available in combination with the program codes stored in the computer system.

SECOND EMBODIMENT

A second embodiment according to the present invention will be described in detail with reference to the drawings. The present invention provides a design support system for designing a printed board adjusted to suppress not only a normal mode radiation but also a common mode radiation for the purpose of suppressing the electromagnetic interference.

The design support system has a basic function for designing a printed board and a novel design function for realizing the suppression of not only the normal mode radiation but also the common mode radiation for the purpose of suppressing the electromagnetic interference.

The design support system may be realized by any available information processing systems such as work stations, personal computers and any other computer systems with software. It is unnecessary to limit the kinds of the hard ware for realizing the design support system.

In this embodiment, the design support system has the basic function for designing the printed board. The design support system further includes a first functional block for provisional placement of elements over the printed board. The design support system further includes a second functional block for provisional routing of interconnections between said elements to take a shortest route of said interconnections. The design support system further includes a third functional block for replacement of said elements inter-connected to each other through said interconnections, so as to minimize a total length of said interconnections in a longitudinal direction of a ground plane of the printed board.

Figure 15:
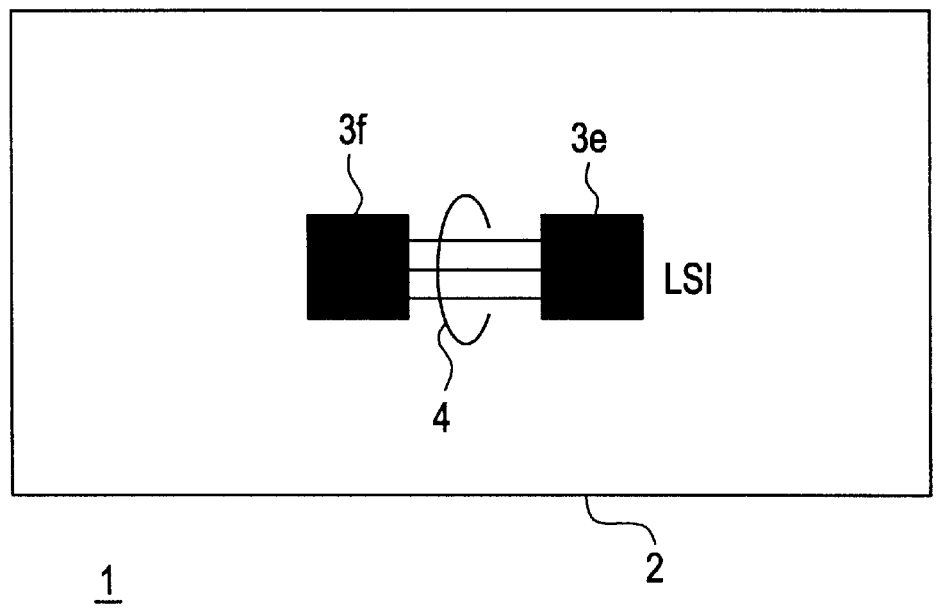
FIG. 15 is a plan view of a ground plane of a printed board and provisionally placed devices, for example, plural LSIs by use of a design support system of the second embodiment in accordance with the present invention.

FIG. 15 is a plan view of a ground plane of a printed board and provisionally placed devices, for example, plural LSIs by use of a design support system of a second embodiment in accordance with the present invention. A rectangle shaped printed board 1 is a subject printed board to be designed by the design support system The printed board 1 has a ground plane 2 which also has a rectangle shape The first functional block provisionally places two LSIs 3*e* and 3*f* over the printed board 1. The two LSIs 3*e* and 3*f* are distanced from each other in a longitudinal direction of the ground plane 2. The second functional block provisionally routes signal interconnections 4 between the two LSIs 3*e* and 3*f* at a shortest route. The signal interconnections 4 interconnecting the two LSIs 3*e* and 3*f* extend in parallel to the longitudinal direction of the ground plane 2.

Figure 16:
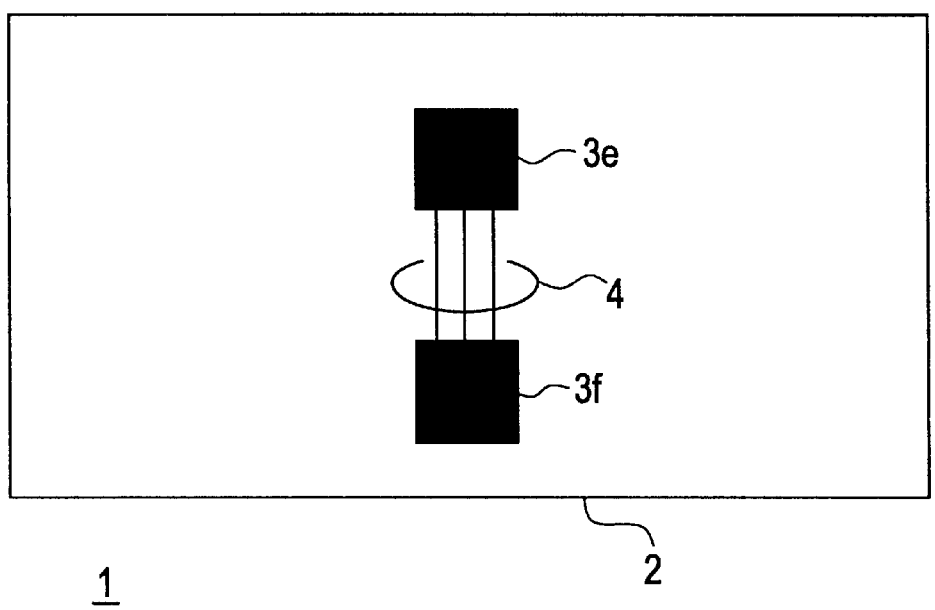
FIG. 16 is a plan view of re-placed devices, for example, plural LSIs over the ground plane by use of a design support system of the second embodiment in accordance with the present invention.

FIG. 16 is a plan view of re-placed devices, for example, plural LSIs over the ground plane by use of a design support system of a second embodiment in accordance with the present invention. The third functional block re-places the LSIs inter-connected to each other through the signal interconnections 4, so as to minimize a total length of the interconnections in the longitudinal direction of the ground plane 2. The two LSIs 3e and 3f are distanced from each other in a lateral direction of the ground plane 2 or in a perpendicular direction to the longitudinal direction. The signal interconnections 4 interconnecting the re-placed two LSIs 3e and 3f extend in parallel to the lateral direction of the ground plane 2, so that a total length of the signal interconnections 4 in the longitudinal direction of the ground plane 2 takes a minimum value of zero, thereby suppressing the common mode radiation from the ground plane.

Figure 17:
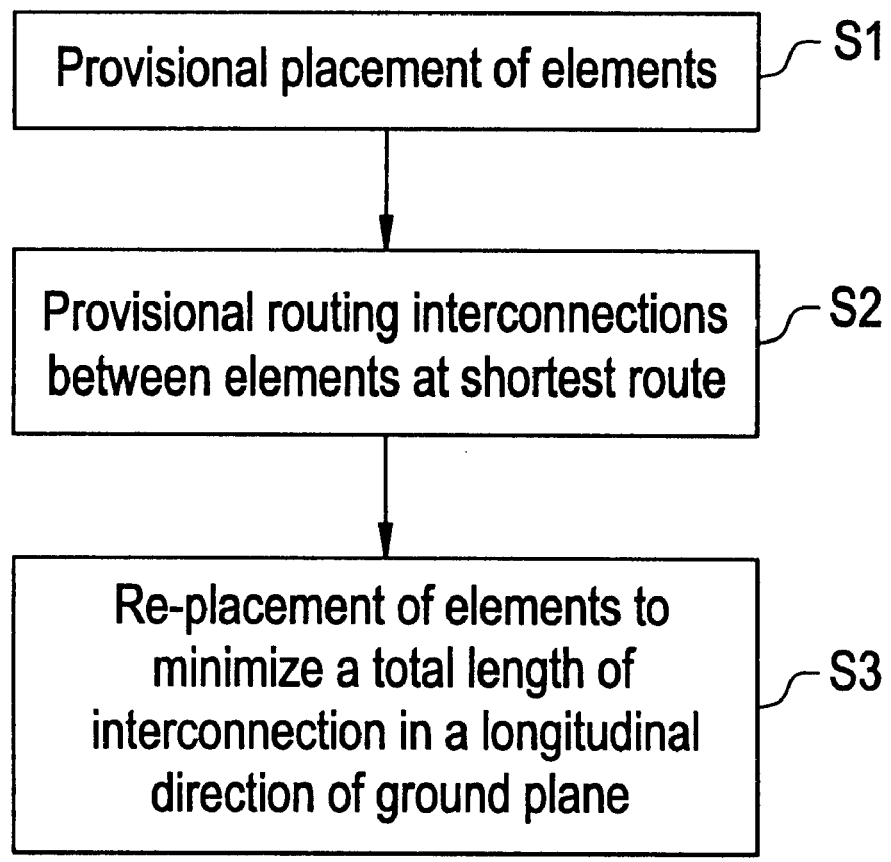
FIG. 17 is a flow chart of sequential steps involved in a novel method of designing a printed board adopted to suppress the common mode radiation from the ground plane in the second embodiment in accordance with the present invention.

FIG. 17 is a flow chart of sequential steps involved in a novel method of designing a printed board adopted to suppress the common mode radiation from the ground plane in a second embodiment in accordance with the present invention.

In a first step, two LSIs 3e and 3f are provisionally placed over the printed board 1, wherein the two LSIs 3e and 3f are distanced from each other in a longitudinal direction of the ground plane 2.

In a step S2, signal interconnections 4 are provisionally routed between the two LSIs 3e and 3f at a shortest route, wherein the signal interconnections 4 extend in parallel to the longitudinal direction of the ground plane 2.

In a step S3, the LSIs inter-connected to each other through the signal interconnections 4 are re-placed so as to minimize the total length of the interconnections 4 in the longitudinal direction of the ground plane 2, whereby the two LSIs 3e and 3f are distanced from each other in the lateral direction of the ground plane 2, and the signal interconnections 4 extend in parallel to the lateral direction of the ground plane 2, so that a total length of the signal interconnections 4 in the longitudinal direction of the ground plane 2 takes a minimum value of zero, thereby suppressing the common mode radiation from the ground plane.

Figure 18A:
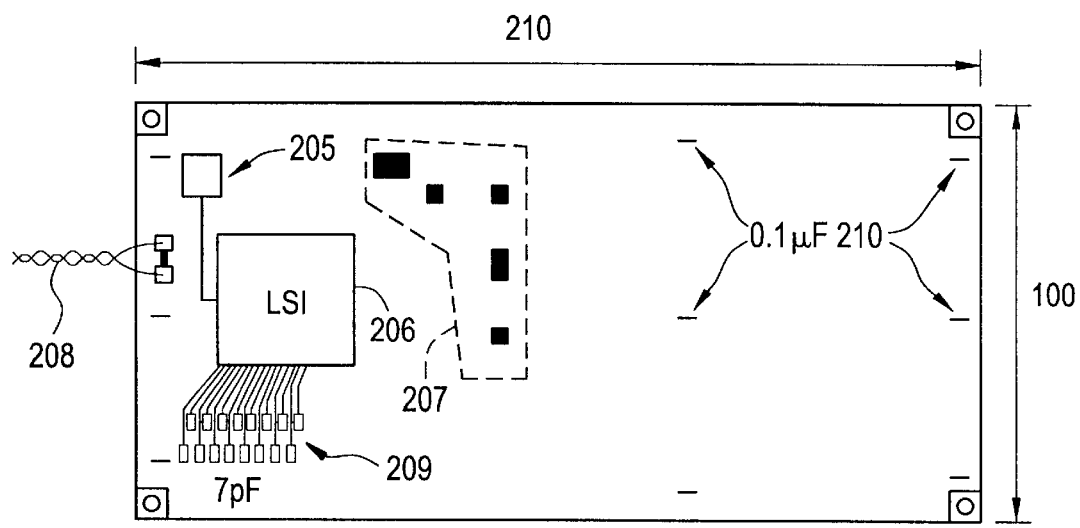
FIG. 18A is a plan view of a printed board as one example to be designed by the design support system.
Figure 18B:
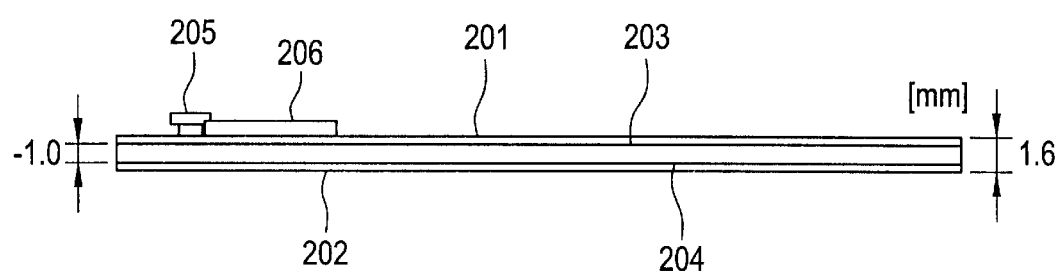
FIG. 18B is a cross sectional view of the printed board of FIG. 18A.

FIG. 18A is a plan view of a printed board as one example to be designed by the design support system. FIG. 18B is a cross sectional view of the printed board of FIG. 18A. The following description is directed to a relationship of the lengths of the respective sides of the ground plane, the frequencies and the common mode radiation from the printed board, and also to the reason why the frequency having a half-wavelength which is substantially equal to the length of the printed board may emphasize the common mode radiation from the printed board 1.

The printed board has a long side length of 210 millimeters, and a short side length of 100 millimeters and a thickness of 1.6 millimeters. The printed board include four layers, for example, a first signal layer 201, a ground plane 203 underlying the first signal layer 201, a power plane 104 underlying the ground plane 203, a second signal layer 202 underlying the power plane 204, The ground plane 203 and the power plane 204 are isolated by an inter-layer insulator and distanced from each other by 1.0 millimeter.

The following circuit elements or devices are placed over the first signal layer 201 of the printed board 1. A quartz oscillator 205 of 40 MHz is placed over the first signal layer 201. A large scale integrated circuit 206 having a field programmable gate array is also placed over the first signal layer 101. The large scale integrated circuit 106 is connected to the quartz oscillator 205. Sixteen load capacitances 209 of 7 pF are placed over the first signal layer 201. The load capacitances 209 are connected to the large scale integrated circuit 206. A de-coupling capacitor of 0.1 micro-F is placed over the first signal layer 201. An initialization circuit 107 is placed over the first signal layer 201. A power cable 108 is connected to power terminals of the printed board.

The quartz oscillator 205 generates a rectangle-wave signal with a frequency of 40 MHz. The rectangle-wave signal is then transmitted to the large scale integrated circuit 206. The large scale integrated circuit 206 outputs a rectangle-wave signal with a frequency of 20 MHz. The rectangle-wave signal is then transmitted to the sixteen load capacitances 209 of 7 pF. The initialization circuit 207 is provided to decide an operation mode of the large scale integrated circuit 206. Except in the initial time period, the quartz oscillator 205, the large scale integrated circuit 206 and the load capacitances 209 remain activated.

The placements of the quartz oscillator 205, the initialization circuit 207 and the load capacitances 209 of FIG. 18A are different from the placements of the quartz oscillator 105, the initialization circuit 107 and the load capacitances 109 of FIG. 5A. The placements of the quartz oscillator 205, the initialization circuit 207 and the load capacitances 209 of FIG. 18A are obtained by having the quartz oscillator 105, the initialization circuit 107 and the load capacitances 109 of FIG. 5A rotate in a clockwise direction around the LSI 106 by 90 degrees.

In accordance with the placement and routing of FIG. 5A, the signal interconnection between the LSI 106 and the quartz oscillator 105 as well as the other signal interconnection between the LSI 106 and the load capacitances 109 extend generally in parallel to the longitudinal direction of the ground plane 2.

In contrast, in accordance with the placement and routing of FIG. 18A, the signal interconnection between the LSI 206 and the quartz oscillator 205 as well as the other signal interconnection between the LSI 206 and the load capacitances 209 extend generally in parallel to the lateral direction perpendicular to the longitudinal direction of the ground plane 2, whereby the total length of the signal interconnections in the longitudinal direction of the ground plane 2 is minimized.

Figure 19:
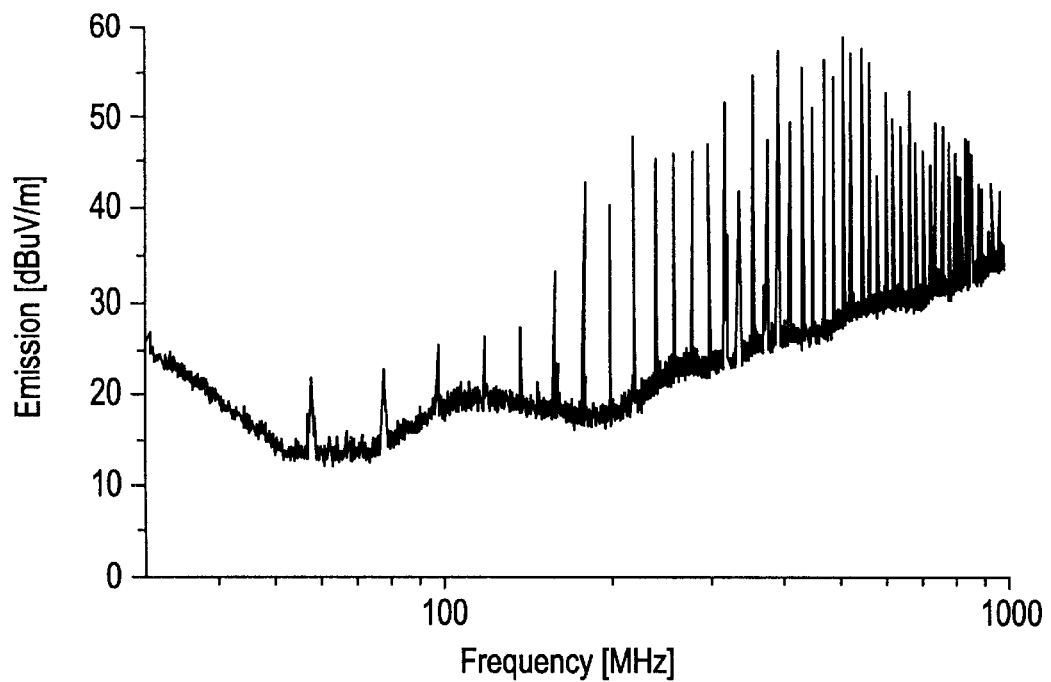
FIG. 19 is a diagram of electromagnetic wave emissions from the printed board over frequency to show a horizontally polarized wave property.
Figure 20:
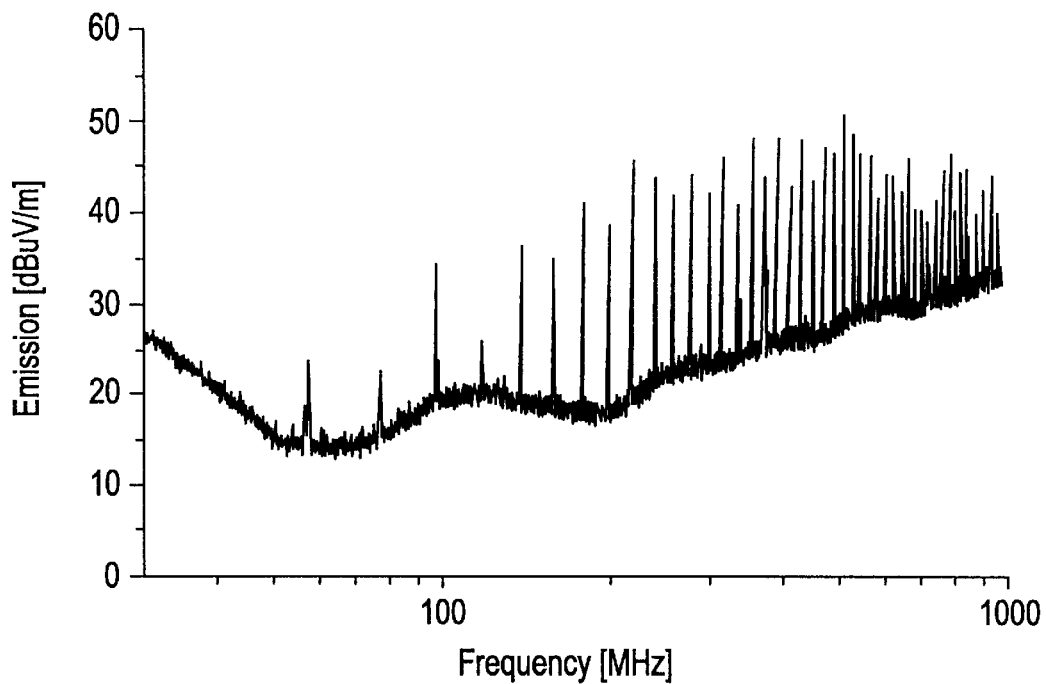
FIG. 20 is a diagram of electromagnetic wave emissions from the printed board over frequency to show a vertically polarized wave property.

FIG. 19 is a diagram of electromagnetic wave emissions from the printed board over frequency to show a horizontally polarized wave property. FIG. 20 is a diagram of electromagnetic wave emissions from the printed board over frequency to show a vertically polarized wave property. The electromagnetic wave emissions from the printed board were measured over a frequency range of 30 MHz to 1 GHz, wherein this frequency range accords to the regulation of measurement of the electromagnetic interference. This measurement was made in a radio wave darkroom with a floor covered by a radio wave absorbent. A measuring antenna was placed to have a distance of 3 meters from the printed board. The printed board and the measuring antenna were set to have a uniform height of 1.5 meters.

The horizontally polarized wave property and the vertically polarized wave property were measured separately in the following first to third cases. In the first case, the printed board was placed in parallel to the floor of the radio wave darkroom. In the second case, the long sides of the printed board was placed in vertical to the floor of the radio wave darkroom. In the third case, the short sides of the printed board was placed in vertical to the floor of the radio wave darkroom. FIG. 19 shows a superimposed result of the horizontally polarized wave properties separately measured in the above three cases. FIG. 20 shows a superimposed result of the vertically polarized wave properties separately measured in the above three cases.

The radiation level from the printed board of FIGS. 18A and 18B is lower than the radiation level from the printed board of FIGS. 5A and 5B. FIG. 19 shows the horizontally polarized wave property having a radiation level peak in the vicinity of 520 MHz which is remarkably lower than the radiation level peak of FIG. 6. FIG. 20 shows the vertically polarized wave property having a radiation level peak in the vicinity of 520 MHz which is remarkably lower than the radiation level peak of FIG. 7.

In the frequency range of 300 MHz to 700 MHz, the horizontally polarized wave is higher in radiation level than the vertically polarized wave. In other frequency ranges than 300 MHz to 700 MHz, the difference in radiation level between the horizontally polarized wave and the vertically polarized wave are small.

Figure 21:
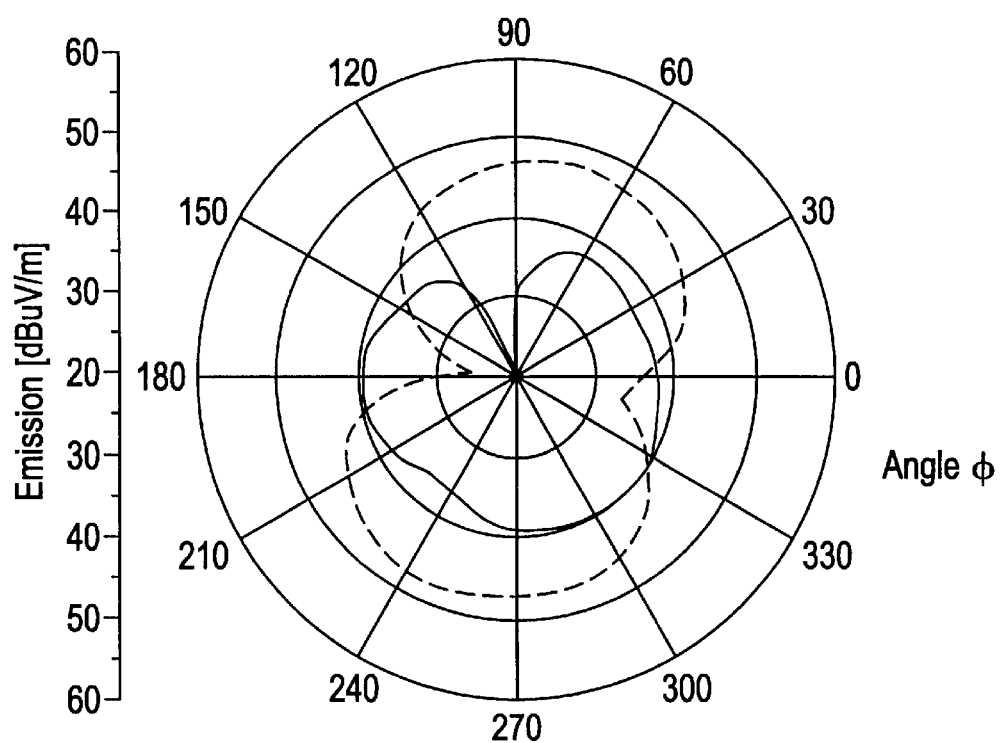
FIG. 21 is a diagram of radiation patterns measured at a frequency of 520 MHz where the radiation level is highest.

Radiation patterns were measured at a frequency of 520 MHz where the radiation level is highest, in order to ascertain the reason why the horizontally polarized wave is higher in radiation level than the vertically polarized wave in the frequency range of 300 MHz to 700 MHz. FIG. 21 is a diagram of radiation patterns measured at a frequency of 520 MHz where the radiation level is highest. A real line represents the horizontally polarized wave. A broken line represents the vertically polarized wave.

In the printed board of FIG. 18A, the interconnections mainly extend in the lateral direction to the longitudinal direction of the ground plane 2. In the printed board of FIG. 5A, the interconnections mainly extend in the longitudinal direction of the ground plane 2. The direction of the interconnections of FIG. 18A is different by 90 degrees from the direction of the interconnections of FIG. 5A. The radiation patterns of FIG. 21 are different from the radiation patterns of FIG. 8. The vertically polarized wave property in the normal mode radiation of FIG. 21 is different in angle by about 90 degrees from the vertically polarized wave property in the normal mode radiation of FIG. 8. The horizontally polarized wave property in the common mode radiation of FIG. 21 is lower than the horizontally polarized wave property in the normal mode radiation of FIG. 8.

The above result means that the re-placement for changing the extending direction of the interconnections from the longitudinal direction of the printed board to the lateral direction results in reduction and suppression of the common mode radiation. In accordance with the respective distributions of the electric and magnetic fields in the vicinity of the ground plane of FIGS. 13 and 14, an exciting direction of the ground plane is parallel to the extending direction of the signal interconnections. In consideration of this fact, it presumable that the interconnections extending in the lateral direction of the ground plane of the printed board of FIG. 18A causes an excitation in the lateral direction but not in the longitudinal direction. A frequency of about 1.50 Hz is the frequency having the half-wavelength which is substantially equal to the short side length of 100 millimeters of the ground plane 2. The above measurement was made in the frequency range of not more than 1 GHz, for which reason no intensive excitation is caused, and thus no intensive radiation is caused.

The re-placement of the elements over the printed board is made so as to minimize the total length of the interconnections between the elements for the purpose of suppressing the common mode radiation.

In the actual printed board, many interconnections are provided between many elements. The issues of how to minimize the total length of the interconnections might be not so easy. In this case, it is also effective that the re-placement is made to reduce the total length of the interconnections between the elements for the purpose of suppressing the common mode radiation.

Accordingly, the design support system includes: a basic functional block for designing a printed board including at least a ground layer; and a first additional functional block for provisional placement of elements over the printed board; a second additional functional block for provisional routing of interconnections between the elements, so as to take a shortest route of the interconnections; and a third additional functional block for re-placement of the elements interconnected to each other through the interconnections, so as to reduce a total length of the interconnections in a resonance-significant direction of a ground layer of the printed board.

It is possible that the resonance-significant direction is a longitudinal direction of the ground layer. In this case, it is possible that the ground layer is a rectangle shape, and the longitudinal direction is parallel to long sides of the ground layer.

It is also possible that the re-placement of the elements is made to minimize the total length of the interconnections in the resonance-significant direction.

It is also possible that the re-placement of the elements is made to change extending directions of the interconnections, so as to reduce the total length of the interconnections in the resonance-significant direction.

It is also possible that the re-placement of the elements is made to minimize the total length of the interconnections in the resonance-significant direction.

It is also possible that the ground layer comprises a ground plane.

The above novel design support system may be realized by any available measures, for example, a computer readable program, wherein program codes are stored in a computer readable storage medium, so that the computer reads the program codes from the storage medium, and implements the program.

The computer readable storage medium may include any available non-volatile storage mediums, for example, a floppy disk, an optical-magnetic disk, ROM, CD-ROM, and any computer-integrated memory devices such as a hard disk as well as any available volatile storage mediums such as RAM.

The program codes may optionally be transmitted from the memory device of the computer system through a transmission medium to other computer system. The transmission medium may include any available medium for transmission, for example, any networks such as internet, communication lines.

It is possible that a part of the above function blocks is realized by the program codes. Alternatively, a differential file or differential program codes may be available in combination with the program codes stored in the computer system.

THIRD EMBODTENT

A third embodiment according to the present invention will be described in detail with reference to the drawings. The present invention provides a design support system for designing a printed board adjusted to suppress not only a normal mode radiation but also a common mode radiation for the purpose of suppressing the electromagnetic interference.

The design support system has a basic function for designing a printed board and a novel design function for realizing the suppression of not only the normal mode radiation but also the common mode radiation for the purpose of suppressing the electromagnetic interference.

The design support system may be realized by any available information processing systems such as work stations, personal computers and any other computer system with software. It is unnecessary to limit the kinds of the hardware for realizing the design support system.

In this embodiment, the design support system has the basic function for designing the printed board. The design support system further includes a first functional block for dividing the ground plane into a plurality of divided sub-regions 1001, 1002, 1003 and 1004, which are bounded by three boundary lines which extend in parallel to the long sides of the ground plane 2. The divided sub-regions 1001, 1002, 1003 and 1004 have the same width as each other. The divided sub-regions 1001 and 1004 extend along the opposite long sides of the ground plane 2. The divided sub-regions 1001 and 1004 correspond to longitudinal sides regions of the ground plane 2.

The number of the divided sub-regions is optional, provided that the side regions adjacent to the opposite longitudinal sides, and at least a center region are necessary.

Figure 22:
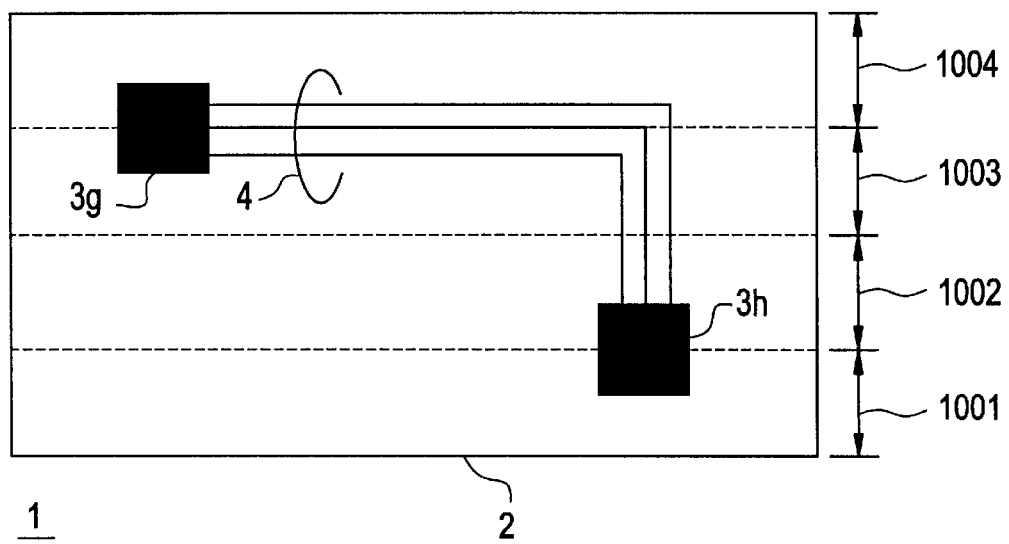
FIG. 22 is a plan view of an undesirably routed interconnection between two large scale integrated circuits without using the display support system of the third embodiment in accordance with the present invention.
Figure 23:
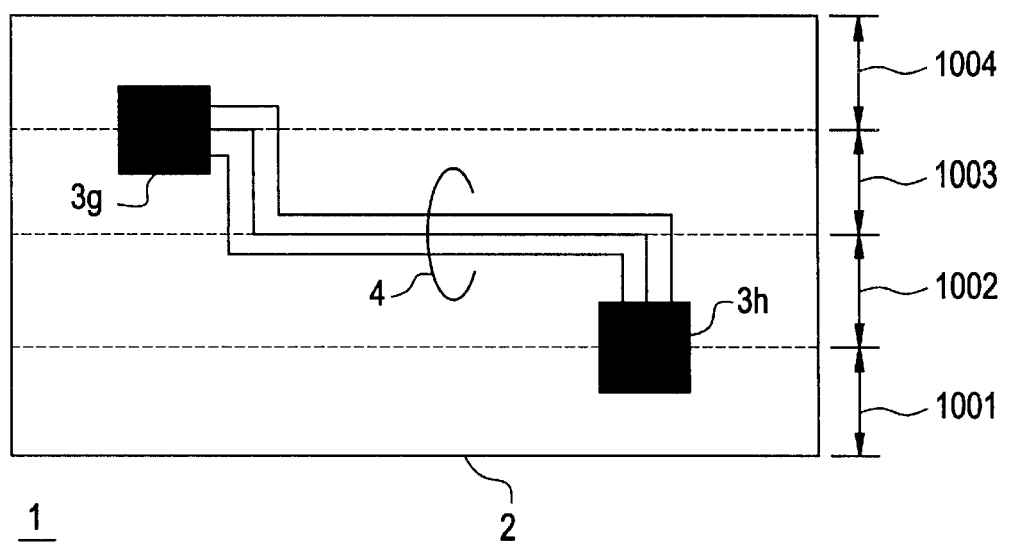
FIG. 23 is a plan view of a desirably routed interconnection between two large scale integrated circuits with using the display support system of the third embodiment in accordance with the present invention.

FIG. 22 is a plan view of an undesirably routed interconnection between two large scale integrated circuits without using the display support system of this embodiment in accordance with the present invention. FIG. 23 is a plan view of a desirably routed interconnection between two large scale integrated circuits with using the display support system of this embodiment in accordance with the present invention. In FIG. 22, a signal interconnection 4 interconnects two large scale integrated circuits 3g and 3h, wherein the signal interconnection 4 extends along the boundary line between the divided sub-regions 1003 and 1004 in the longitudinal direction. In FIG. 23, a signal interconnection 4 inter-connects two large scale integrated circuits 3g and 3h, wherein the signal interconnection 4 extends along the boundary line between the divided sub-regions 1002 and 1003 in the longitudinal direction.

If the interconnection 4 extends in the longitudinal direction and is adjacent to either one of the opposite long sides of the ground plane 2 of the printed board 1, then a common mode radiation is intensive. If the interconnection 4 extends in the longitudinal direction and is far from both the opposite long sides of the ground plane 2 of the printed board 1, then the common mode radiation is weak. In order to suppress the common mode radiation from the ground plane, it is effective that the signal interconnection 4 extending in the longitudinal direction is far from both the opposite long sides of the ground plane 2 as many as possible, or is as closely to the center longitudinal axis of the ground plane 2 as possible. For this reason, routing the signal interconnection 4 of FIG. 23 is better than routing the signal interconnection 4 of FIG. 22 in order to effectively suppress the common mode radiation from the ground plane.

Figure 24:
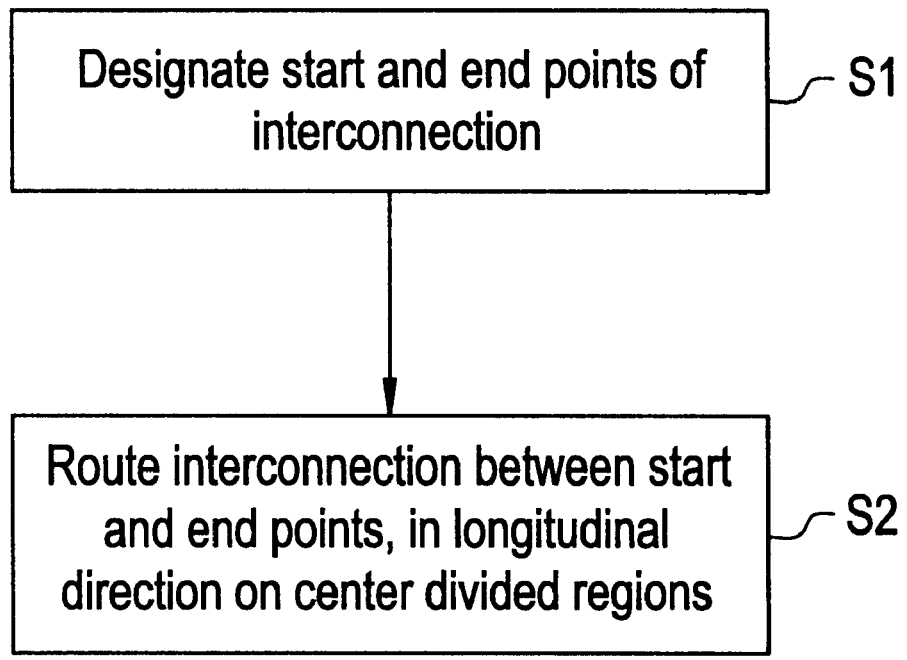
FIG. 24 is a flow chart of respective steps of routing the interconnections between two elements in accordance with the design support system in the third embodiment in accordance with the present invention.

FIG. 24 is a flow chart of respective steps of routing the interconnections between two elements in accordance with the design support system in this embodiment in accordance with the present invention.

In a first step S1, the system designates a start point and an end point of a signal interconnection.

In a second step S2, the system routes the signal interconnection between the start and end points, so that the signal interconnection in the longitudinal direction extends on the center divided sub-regions 1002 and 1003, thereby avoiding to route the signal interconnection extending in the longitudinal direction and on the opposite sides divided sub-regions 1001 and 1004.

Figure 25:
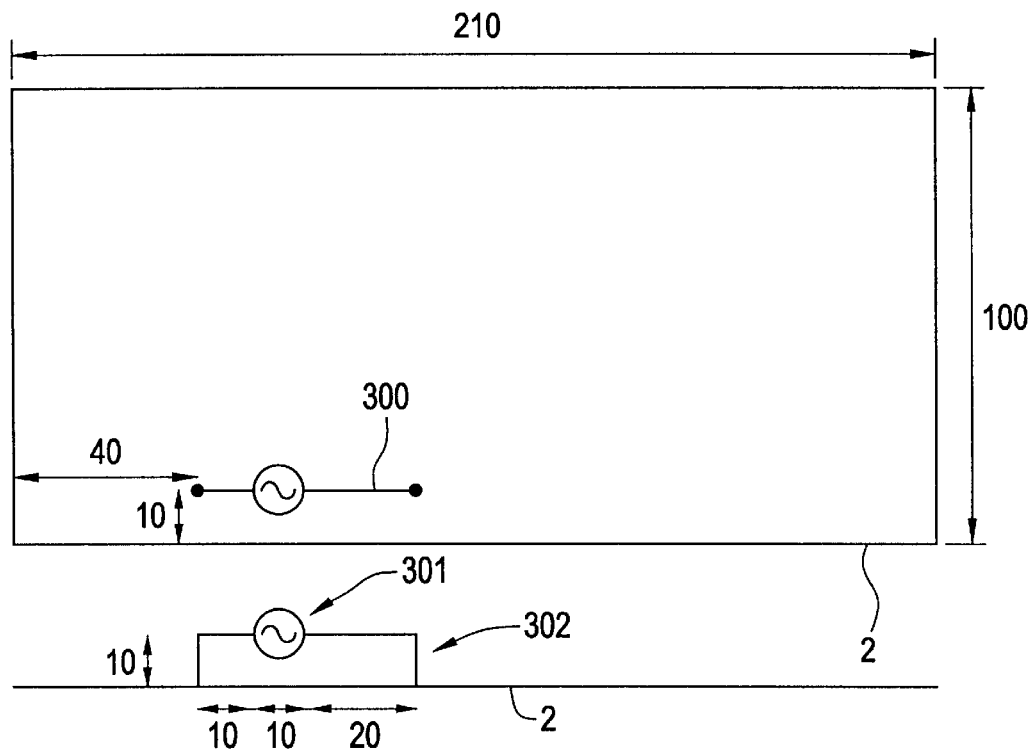
FIG. 25 is a plan view of an undesirable printed board mode, wherein a signal interconnection extends in parallel to a long side of a ground plane and relatively adjacent to the long side.

FIG. 25 is a plan view of an undesirable printed board mode, wherein a signal interconnection extends in parallel to a long side of a ground plane and relatively adjacent to the long side. The interconnection 300 has a horizontal distance of 10 millimeters from the long side of the ground plane 2. The interconnection 300 has another horizontal distance of 40 millimeters from a short side of the ground plane 2. The interconnection 300 has a uniform height of 10 millimeters from the ground plane 2. The interconnection 300 has a power source 301 and a load 302. The interconnection 300 has a horizontal length of 40 millimeters in the longitudinal direction.

Figure 26:
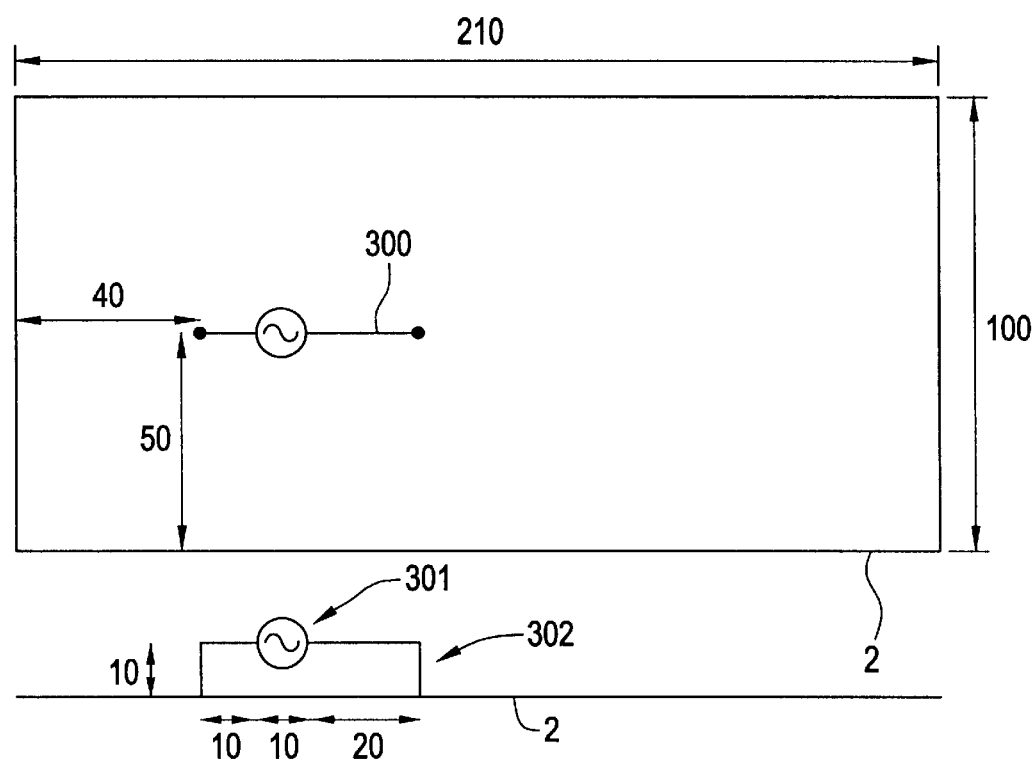
FIG. 26 is a plan view of a desirable printed board mode, wherein a signal interconnection extends in parallel to a long side of a ground plane and relatively far from the long side.

FIG. 26 is a plan view of a desirable printed board mode, wherein a signal interconnection extends in parallel to a long side of a ground plane and relatively far from the long side. The interconnection 300 has a horizontal distance of 50 millimeters from the long side of the ground plane 2. The interconnection 300 has another horizontal distance of 40 millimeters from a short side of the ground plane 2. The interconnection 300 has a uniform height of 10 millimeters from the ground plane 2. The interconnection 300 has a power source 301 and a load 302. The interconnection 300 has a horizontal length of 40 millimeters in the longitudinal direction.

Figure 27:
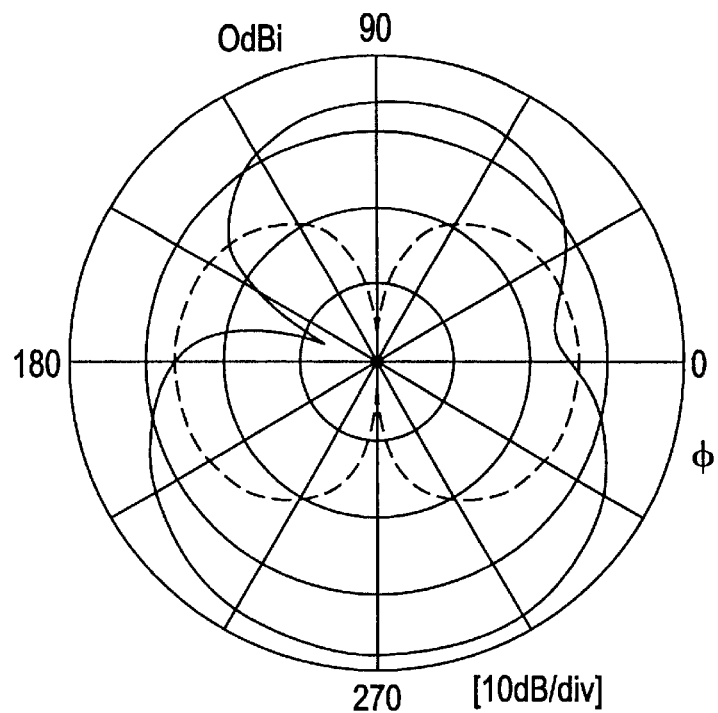
FIG. 27 is a diagram of radiation patterns measured at a frequency of 520 MHz, where the radiation level is highest, from the undesirable printed board mode of FIG. 25.

FIG. 27 is a diagram of radiation patterns measured at a frequency of 520 MHz, where the radiation level is highest, from the undesirable printed board mode of FIG. 25. A real line represents the horizontally polarized wave. A broken line represents the vertically polarized wave.

The horizontally polarized wave represented by the real line has two peaks in the vicinity of 90 degrees and 270 degrees and two valleys in the vicinity of 0 degree and 180 degrees, so that the horizontally polarized wave has a pattern of partially overlapped dual deformed-circles, such as a 8-character shape. The horizontally polarized wave is asymmetrical with reference to a line between 0 degree and 180 degrees. The horizontally polarized wave is thus oriented toward the long side of the ground plane, to which the signal interconnection 300 is close. In contrast, the vertically polarized wave represented by the broken line has two peaks in the vicinity of 0 degree and 180 degrees and two valleys in the vicinity of 270 degrees, so that the vertically polarized wave has a pattern of partially overlapped dual deformed-circles, such as a 8-character shape. The horizontally polarized wave is symmetrical with reference to a line between 0 degree and 180 degrees and also with reference to a line between 90 degrees and 270 degrees. The horizontally polarized wave is free of the orientation toward the long side of the ground plane, to which the signal interconnection 300 is close.

Figure 28:
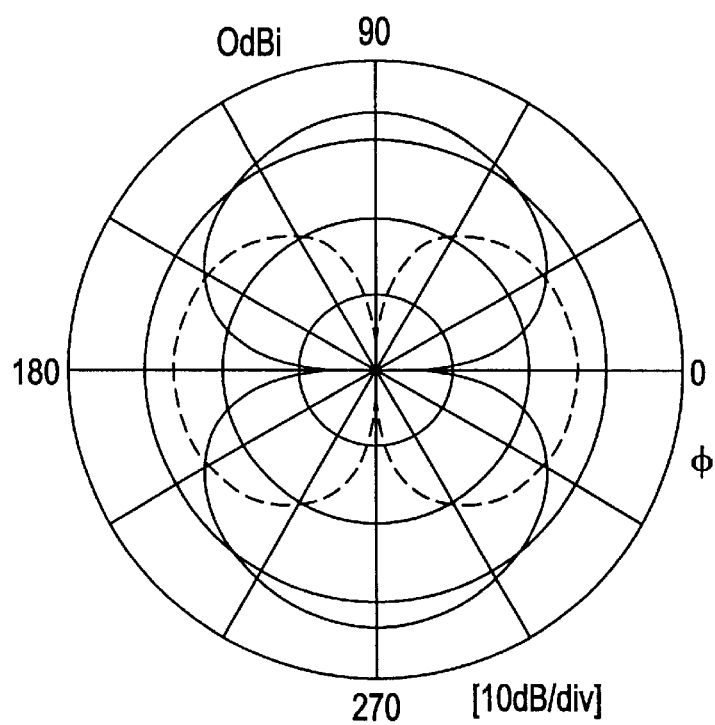
FIG. 28 is a diagram of radiation patterns measured at a frequency of 520 MHz, where the radiation level is highest, from the desirable printed board mode of FIG. 26.

FIG. 28 is a diagram of radiation patterns measured at a frequency of 520 MHz, where the radiation level is highest, from the desirable printed board mode of FIG. 26. A real line represents the horizontally polarized wave. A broken line represents the vertically polarized wave.

The horizontally polarized wave represented by the real line has two peaks in the vicinity of 90 degrees and 270 degrees and two valleys in the vicinity of 0 degree and 180 degrees, so that the horizontally polarized wave has a pattern of partially overlapped dual deformed-circles, such as a 8-character shape. The horizontally polarized wave is symmetrical with reference to a line between 0 degree and 180 degrees and with reference to another line between 90 degrees and 270 degrees. The horizontally polarized wave is free of any orientation toward the long side of the ground plane, to which the signal interconnection 300 is close. The vertically polarized wave represented by the broken line has two peaks in the vicinity of 0 degree and 180 degrees and two valleys in the vicinity of 270 degrees, so that the vertically polarized wave has a pattern of partially overlapped dual deformed-circles, such as a 8-character shape. The horizontally polarized wave is symmetrical with reference to a line between 0 degree and 180 degrees and also with reference to a line between 90 degrees and 270 degrees. The horizontally polarized wave is free of the orientation toward the long side of the ground plane, to which the signal interconnection 300 is close.

In the electromagnetic interference measurement operation, the printed board is placed on a turn table to rotate the printed board during measurement of the maximum radiation level. For this reason, if the signal interconnection is routed adjacent to any side of the ground plane, then the radiation level is high.

It is thus effective to route the interconnection in the longitudinal direction as far from the opposite long sides of the ground plane 2 as possible in order to suppress the common mode radiation from the ground plane.

Accordingly, a design support system includes: a basic function block for designing a printed board including at least a ground layer; a first additional function block for recognizing at least a longitudinal side region adjacent to at least a long side of said ground layer; and a second additional function block for routing at least a designated interconnection between elements placed over said printed board, so as to reduce a total length, in a longitudinal direction of said ground layer, of said interconnection extending on said at least longitudinal side region.

It is possible that routing said interconnections is made so as to minimize said total length, in said longitudinal direction, of said interconnections extending on said at least longitudinal side region.

It is also possible that said ground layer is rectangle-shaped, and said at least longitudinal side region includes a pair of stripe-shaped longitudinal side regions along paired long sides of said ground layer.

The above novel design support system may be realized by any available measures, for example, a computer readable program, wherein program codes are stored in a computer readable storage medium, so that the computer reads the program codes from the storage medium, and implements the program.

The computer readable storage medium may include any available non-volatile storage mediums, for example, a floppy disk, an optical-magnetic disk, ROM, CD-ROM, and any computer-integrated memory devices such as a hard disk as well as any available volatile storage mediums such as RAM.

The program codes may optionally be transmitted from the memory device of the computer system through a transmission medium to other computer system. The transmission medium may include any available medium for transmission, for example, any networks such as internet, communication lines.

It is possible that a part of the above function blocks is realized by the program codes. Alternatively, a differential file or differential program codes may be available in combination with the program codes stored in the computer system.

FOURTH EMBODIMENT

A fourth embodiment according to the present invention will be described in detail with reference to the drawings. The present invention provides a design support system for designing a printed board adjusted to suppress not only a normal mode radiation but also a common mode radiation for the purpose of suppressing the electromagnetic interference.

The design support system has a basic function for designing a printed board and a novel design function for realizing the suppression of not only the normal mode radiation but also the common mode radiation for the purpose of suppressing the electromagnetic interference.

The design support system may be realized by any available information processing systems such as work stations, personal computers and any other computer systems with software. It is unnecessary to limit the kinds of the hard ware for realizing the design support system.

In this embodiment, the design support system has the basic function for designing the printed board. As shown in FIGS. 23 and 24, the design support system further includes a first functional block for dividing the ground plane into a plurality of divided sub-regions 1001, 1002, 1003 and 1004, which are bounded by three boundary lines which extend in parallel to the long sides of the ground plane 2. The divided sub-regions 1001, 1002, 1003 and 1004 have the same width as each other. The divided sub-regions 1001 and 1004 extend along the opposite long sides of the ground plane 2. The divided sub-regions 1001 and 1004 correspond to longitudinal sides regions of the ground plane 2.

The number of the divided sub-regions is optional, provided that the side regions adjacent to the opposite longitudinal sides, and at least a center region are necessary.

Figure 29:
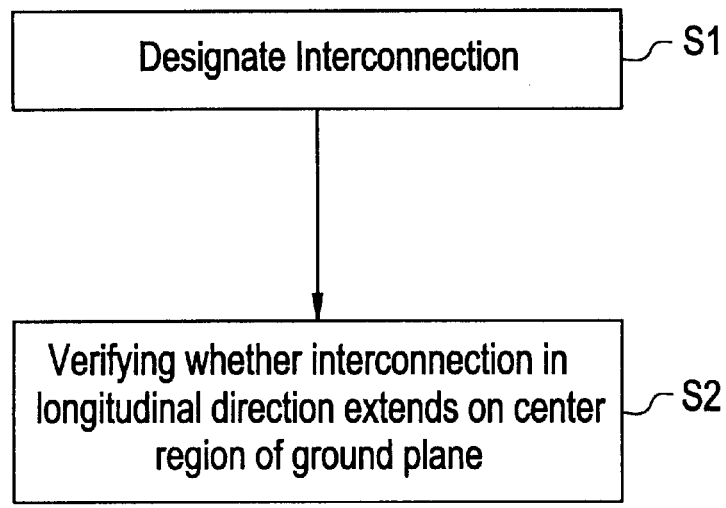
FIG. 29 is a flow chart of respective steps of checking the route of the interconnections between two elements in accordance with the design support system in the fourth embodiment in accordance with the present invention.

FIG. 29 is a flow chart of respective steps of checking the route of the interconnections between two elements in accordance with the design support system in this embodiment in accordance with the present invention.

In a first step S1, the system designates at least an interconnection between elements placed over the printed board.

In a second step S2, the system finds a first total length, in a longitudinal direction of the ground layer, of an entirety of the designated interconnection, and also finds a second total length, in the longitudinal direction, of the interconnection extending on the opposite side sub-regions 1001 and 1004. The system further verifies whether a ratio of the second total length to the first total length is within a predetermined allowable range. If this ratio is low, then this means preferable.

It is thus effective to route the interconnection in the longitudinal direction as far from the opposite long sides of the ground plane 2 as possible in order to suppress the common mode radiation from the ground plane.

Accordingly, a design support system includes: a basic means for designing a printed board including at least a ground layer; a first additional means for recognizing at least a longitudinal side region adjacent to at least a long side of the ground layer; and a second additional means for both finding a first total length, in a longitudinal direction of the ground layer, of an entirety of at least a designated interconnection between elements placed over the printed board, and finding a second total length, in the longitudinal direction, of the interconnection extending on the at least longitudinal side region.

It is also possible to further comprise: a third additional function block for verifying whether a ratio of the second total length to the first total length is within a predetermined allowable range.

It is also possible to further more comprise a fourth additional function block for re-routing the interconnection, so as to reduce the ratio of the second total length to the first total length, if the ratio of the second total length to the first total length exceeds the predetermined allowable range.

It is further more possible that re-routing the interconnection is made so as to minimize the ratio of the second total length to the first total length.

It is further more possible to further comprise: a fourth additional function block for re-routing the interconnection, so as to reduce the ratio of the second total length to the first total length.

It is also possible that re-routing the interconnection is made so as to minimize the ratio of the second total length to the first total length.

It is also possible that the ground layer is rectangle-shaped, and the at least longitudinal side region includes a pair of stripe-shaped longitudinal side regions along paired long sides of the ground layer.

The above novel design support system may be realized by any available measures, for example, a computer readable program, wherein program codes are stored in a computer readable storage medium, so that the computer reads the program codes from the storage medium, and implements the program.

The computer readable storage medium may include any available non-volatile storage mediums, for example, a floppy disk, an optical-magnetic disk, ROM, CD-ROM, and any computer-integrated memory devices such as a hard disk as well as any available volatile storage mediums such as RAM.

The program codes may optionally be transmitted from the memory device of the computer system through a transmission medium to other computer system. The transmission medium may include any available medium for transmission, for example, any networks such as internet, communication lines.

It is possible that a part of the above function blocks is realized by the program codes. Alternatively, a differential file or differential program codes may be available in combination with the program codes stored in the computer system.

FIFTH EMBODIMENT

A fifth embodiment according to the present invention will be described in detail with reference to the drawings. The present invention provides a design support system for designing a printed board adjusted to suppress not only a normal mode radiation but also a common mode radiation for the purpose of suppressing the electromagnetic interference.

The design support system has a basic function for designing a printed board and a novel design function for realizing the suppression of not only the normal mode radiation but also the common mode radiation for the purpose of suppressing the electromagnetic interference.

The design support system may be realized by any available information processing systems such as work stations, personal computers and any other computer systems with software. It is unnecessary to limit the kinds of the hard ware for realizing the design support system.

In this embodiment, the design support system has the basic function for designing the printed board. As shown in FIGS. 23 and 24, the design support system further includes a first functional block for dividing the ground plane into a plurality of divided sub-regions 1001, 1002, 1003 and 1004, which are bounded by three boundary lines which extend in parallel to the long sides of the ground plane 2. The divided sub-regions 1001, 1002, 1003 and 1004 have the same width as each other. The divided sub-regions 1001 and 1004 extend along the opposite long sides of the ground plane 2. The divided sub-regions 1001 and 1004 correspond to longitudinal sides regions of the ground plane 2.

The number of the divided sub-regions is optional, provided that the side regions adjacent to the opposite longitudinal sides, and at least a center region are necessary.

Figure 30:
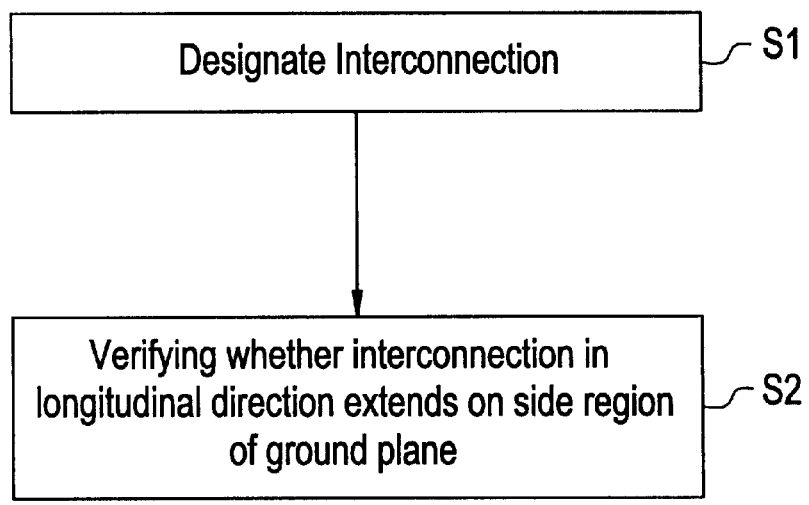
FIG. 30 is a flow chart of respective steps of checking the route of the interconnections between two elements in accordance with the design support system in the fifth embodiment in accordance with the present invention.

FIG. 30 is a flow chart of respective steps of checking the route of the interconnections between two elements in accordance with the design support system in this embodiment in accordance with the present invention.

In a first step S1, the system designates at least an interconnection between elements placed over the printed board.

In a second step 52, the system finds a first total length, in a longitudinal direction of the ground layer, of an entirety of the designated interconnection, and also finds a third total length, in the longitudinal direction, of the interconnection extending on the center sub-regions 1002 and 1003. The system further verifies whether a ratio of the third total length to the first total length is within a predetermined allowable range. If this ratio is high, then this means preferable.

It is thus effective to route the interconnection in the longitudinal direction as far from the opposite long sides of the ground plane 2 as possible in order to suppress the common mode radiation from the ground plane.

Accordingly, a design support system includes: a basic functional block for designing a printed board including at least a ground layer; a first additional functional block for recognizing at least a longitudinal side region adjacent to at least a long side of the ground layer; and a second additional functional block for both finding a first total length, in a longitudinal direction of the ground layer, of an entirety of at least a designated interconnection between elements placed over the printed board, and finding a third total length, in the longitudinal direction, of the interconnection extending on a center region other than the at least longitudinal side region.

It is also possible to further comprise: a third additional functional block for verifying whether a ratio of the third total length to the first total length is within a predetermined allowable range.

It is further possible to further comprise a fourth additional functional block for re-routing the interconnection, so as to increase the ratio of the third total length to the first total length, if the ratio of the third total length to the first total length exceeds the predetermined allowable range.

It is further more possible that re-routing the interconnection is made so as to maximize the ratio of the third total length to the first total length.

It is further more possible further comprise: a fourth additional functional block for re-routing the interconnection, so as to increase the ratio of the third total length to the first total length.

It is also possible that re-routing the interconnection is made so as to maximize the ratio of the third total length to the first total length.

It is also possible that the ground layer is rectangle-shaped, and the at least longitudinal side region includes a pair of stripe-shaped longitudinal side regions along paired long sides of the ground layer.

The above novel design support system may be realized by any available measures, for example, a computer readable program, wherein program codes are stored in a computer readable storage medium, so that the computer reads the program codes from the storage medium, and implements the program.

The computer readable storage medium may include any available non-volatile storage mediums, for example, a floppy disk, an optical-magnetic disk, ROM, CD-ROM, and any computer-integrated memory devices such as a hard disk as well as any available volatile storage mediums such as RAM.

The program codes may optionally be transmitted from the memory device of the computer system through a transmission medium to other computer system The transmission medium may include any available medium for transmission, for example, any networks such as internet, communication lines.

It is possible that a part of the above function blocks is realized by the program codes. Alternatively, a differential file or differential program codes may be available in combination with the program codes stored in the computer system, Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A design support system including:
   a basic means for designing a printed board including at least a ground layer; and
   a first additional means for finding at least one, resonant frequency for, said ground layer based on an information of a resonance-significant size of said ground layer.

2. The design support system as claimed in claim 1, wherein said first additional means calculates said at least one resonant frequency on the basis that said resonance-significant size is substantially equal to a product of an integer number and a half-wavelength of said at least one resonant frequency.

3. The design support system as claimed in claim 1, wherein said first additional means calculates said at least one resonant frequency on the basis that a product of said resonance-significant size and a constant, which is predetermined depending on said ground layer, is substantially equal to a product of an integer number and a half-wavelength of said at least one resonant frequency.

4. The design support system as claimed in claim 3, wherein said constant is larger than 1.

5. The design support system as claimed in claim 1, wherein said resonance-significant size is a length of said ground layer in a longitudinal direction.

6. The design support system as claimed in claim 5, wherein said ground layer is a rectangle shape, and said resonance-significant size is either one of long and short sides lengths of said ground layer.

7. The design support system as claimed in claim 1, wherein said first additional means is connected to said basic means for directly fetching said information of said resonance-significant size of said ground layer from said basic means.

8. The design support system as claimed in claim 1, further including a second additional means connected to said first additional means for receiving said resonant frequency from said first additional means and for verifying whether said resonant frequency is within an allowable frequency range predetermined in accordance with an electromagnetic interference regulation.

9. The design support system as claimed in claim 1, wherein said first additional means further verifies whether said resonant frequency is within an allowable frequency range predetermined in accordance with an electromagnetic interference regulation.

10. The design support system as claimed in claim 1, wherein said ground layer comprises a ground plane.

11. A design support system including:
    a basic means for designing a printed board including at least a ground layer; and
    a first additional means for provisional placement of elements over said printed board;
    a second additional means for provisional routing of interconnections between said elements; and
    a third additional means for re-placement of said elements interconnected to each other through said interconnections, so as to reduce a total length of said interconnections in a resonance-significant direction of a ground layer of said printed board.

12. The design support system as claimed in claim 11, wherein said resonance-significant direction is a longitudinal direction of the ground layer.

13. The design support system as claimed in claim 12, wherein said ground layer is a rectangle shape, and said longitudinal direction is parallel to long sides of said ground layer.

14. The design support system as claimed in claim 11, wherein said re-placement of said elements is made to minimize said total length of said interconnections in said resonance-significant direction.

15. The design support system as claimed in claim 11, wherein said re-placement of said elements is made to change extending directions of said interconnections, so as to reduce said total length of said interconnections in said resonance-significant direction.

16. The design support system as claimed in claim 15, wherein said re-placement of said elements is made to minimize said total length of said interconnections in said resonance-significant direction.

17. The design support system as claimed in claim 11, wherein said ground layer comprises a ground plane.

18. The design support system as claimed in claim 11, wherein said provisional routing of said interconnections is made so as to take a shortest route of said interconnections.

19. A design support system including:
    a basic means for designing a printed board including at least a ground layer; and
    a first additional means for recognizing at least a longitudinal side region adjacent to at least a long side of said ground layer; and
    a second additional means for routing at least a designated interconnection between elements placed over said printed board, so as to reduce a total length, in a longitudinal direction of said ground layer, of said interconnection extending on said at least longitudinal side region.

20. The design support system as claimed in claim 19, wherein routing said interconnections is made so as to minimize said total length, in said longitudinal direction, of said interconnections extending on said at least longitudinal side region.

21. The design support system as claimed in claim 19, wherein said ground layer is rectangle-shaped, and said at least longitudinal side region includes a pair of stripe-shaped longitudinal side regions along paired long sides of said ground layer.

22. A design support system including:
a basic means for designing a printed board including at least a ground layer; and
a first additional means for recognizing at least a longitudinal side region adjacent to at least a long side of said ground layer; and
a second additional means for both finding a first total length, in a longitudinal direction of said ground layer, of an entirety of at least a designated interconnection between elements placed over said printed board, and finding a second total length, in said longitudinal direction, of said interconnection extending on said at least longitudinal side region.

23. The design support system as claimed in claim 22, further comprising:
a third additional means for verifying whether a ratio of said second total length to said first total length is within a predetermined allowable range.

24. The design support system as claimed in claim 23, further comprising:
a fourth additional means for re-routing said interconnection, so as to reduce said ratio of said second total length to said first total length, if said ratio of said second total length to said first total length exceeds said predetermined allowable range.

25. The design support system as claimed in claim 24, wherein re-routing said interconnection is made so as to minimize said ratio of said second total length to said first total length.

26. The design support system as claimed in claim 22, further comprising:
a fourth additional means for re-routing said interconnection, so as to reduce said ratio of said second total length to said first total length.

27. The design support system as claimed in claim 26, wherein re-routing said interconnection is made so as to minimize said ratio of said second total length to said first total length.

28. The design support system as claimed in claim 22, wherein said ground layer is rectangle-shaped, and said at least longitudinal side region includes a pair of stripe-shaped longitudinal side regions along paired long sides of said ground layer.

29. A design support system including:
a basic means for designing a printed board including at least a ground layer; and
a first additional means for recognizing at least a longitudinal side region adjacent to at least a long side of said ground layer; and
a second additional means for both finding a first total length, in a longitudinal direction of said ground layer, of an entirety of at least a designated interconnection between elements placed over said printed board, and finding a third total length, in said longitudinal direction, of said interconnection extending on a center region other than said at least longitudinal side region.

30. The design support system as claimed in claim 29, further comprising:
a third additional means for verifying whether a ratio of said third total length to said first total length is within a predetermined allowable range.

31. The design support system as claimed in claim 30, further comprising:
a fourth additional means for re-routing said interconnection, so as to increase said ratio of said third total length to said first total length, if said ratio of said third total length to said first total length exceeds said predetermined allowable range.

32. The design support system as claimed in claim 31, wherein re-routing said interconnection is made so as to maximize said ratio of said third total length to said first total length.

33. The design support system as claimed in claim 29, further comprising:
a fourth additional means for re-routing said interconnection, so as to increase said ratio of said third total length to said first total length.

34. The design support system as claimed in claim 33, wherein re-routing said interconnection is made so as to maximize said ratio of said third total length to said first total length.

35. The design support system as claimed in claim 29, wherein said ground layer is rectangle-shaped, and said at least longitudinal side region includes a pair of stripe-shaped longitudinal side regions along paired long sides of said ground layer.

36. A method of designing a printed board having at least one ground layer, said method including the steps of:
finding at least a resonance-significant size for said ground layer;
calculating at least one resonant frequency to said ground layer based on an information of said resonance-significant size of said ground layer.

37. The method as claimed in claim 36, wherein said at least one resonant frequency is calculated on the basis that said resonance-significant size is substantially equal to a product of an integer number and a half-wavelength of said at least one resonant frequency.

38. The method as claimed in claim 36, wherein said at least one resonant frequency is calculated on the basis that a product of said resonance-significant size and a constant, which is predetermined depending on said ground layer, is substantially equal to a product of an integer number and a half-wavelength of said at least one resonant frequency.

39. The method as claimed in claim 38, wherein said constant is larger than 1.

40. The method as claimed in claim 36, wherein said resonance-significant size is a length of said ground layer in a longitudinal direction.

41. The method as claimed in claim 40, wherein said ground layer is a rectangle shape, and said resonance-significant size is either one of long and short sides lengths of said ground layer.

42. The method as claimed in claim 36, further including the step of: verifying whether said resonant frequency is within an allowable frequency range predetermined in accordance with an electromagnetic interference regulation.

43. The method as claimed in claim 36, wherein said ground layer comprises a ground plane.

44. A method of designing a printed board having at least one ground layer, said method including the steps of:
executing a provisional placement of elements over said printed board;
executing a provisional routing of interconnections between said elements; and
executing a re-placement of said elements interconnected to each other through said interconnections, so as to reduce a total length of said interconnections in a resonance-significant direction of a ground layer of said printed board.

45. The method as claimed in claim 44, wherein said resonance-significant direction is a longitudinal direction of the ground layer.

46. The method as claimed in claim 45, wherein said ground layer is a rectangle shape, and said longitudinal direction is parallel to long sides of said ground layer.

47. The method as claimed in claim 44, wherein said re-placement of said elements is made to minimize said total length of said interconnections in said resonance-significant direction.

48. The method as claimed in claim 44, wherein said re-placement of said elements is made to change extending directions of said interconnections, so as to reduce said total length of said interconnections in said resonance-significant direction.

49. The method as claimed in claim 48, wherein said re-placement of said elements is made to minimize said total length of said interconnections in said resonance-significant direction.

50. The method as claimed in claim 44, wherein said ground layer comprises a ground plane.

51. The method as claimed in claim 44, wherein said provisional routing of said interconnections is made so as to take a shortest route of said interconnections.

52. A method of designing a printed board having at least one ground layer, said method including the steps of:
recognizing at least a longitudinal side region adjacent to at least a long side of said ground layer; and
routing at least a designated interconnection between elements placed over said printed board, so as to reduce a total length, in a longitudinal direction of said ground layer, of said interconnection extending on said at least longitudinal side region.

53. The method as claimed in claim 52, wherein routing said interconnections is made so as to minimize said total length, in said longitudinal direction, of said interconnections extending on said at least longitudinal side region.

54. The method as claimed in claim 52, wherein said ground layer is rectangle-shaped, and said at least longitudinal side region includes a pair of; stripe-shaped longitudinal side regions along paired long sides of said ground layer.

55. A method of designing a printed board having at least one ground layer, said method including the steps of:
recognizing at least a longitudinal side region adjacent to at least a long side of said ground layer; and
finding a first total length, in a longitudinal direction of said ground layer, of an entirety of at least a designated interconnection between elements placed over said printed board, and finding a second total length, in said longitudinal direction, of said interconnection extending on said at least longitudinal side region.

56. The method as claimed in claim 55, further comprising the step of: verifying whether a ratio of said second total length to said first total length is within a predetermined allowable range.

57. The method as claimed in claim 56, furthermore comprising the step of: re-routing said interconnection, so as to reduce said ratio of said second total length to said first total length, if said ratio of said second total length to said first total length exceeds said predetermined allowable range.

58. The method as claimed in claim 57, wherein re-routing said interconnection is made so as to minimize said ratio of said second total length to said first total length.

59. The method as claimed in claim 55, further comprising the step of: re-routing said interconnection, so as to reduce said ratio of said second total length to said first total length.

60. The method as claimed in claim 59, wherein re-routing said interconnection is made so as to minimize said ratio of said second total length to said first total length.

61. The method as claimed in claim 55, wherein said ground layer is rectangle-shaped, and said at least longitudinal side region includes a pair of stripe-shaped longitudinal side regions along paired long sides of said ground layer.

62. A method of designing a printed board having at least one ground layer, said method including the steps of:
recognizing at least a Longitudinal side region adjacent to at least a long side of said ground layer; and
finding a first total length, in a longitudinal direction of said ground layer, of an entirety of at least a designated interconnection between elements placed over said printed board, and finding a third total length, in said longitudinal direction, of said interconnection extending on a center region other than said at least longitudinal side region.

63. The method as claimed in claim 62, further comprising the step of: verifying whether a ratio of said third total length to said first total length is within a predetermined allowable range.

64. The method as claimed in claim 63, furthermore comprising the step of: re-routing said interconnection, so as to increase said ratio of said third total length to said first total length, if said ratio of said third total length to said first total length exceeds said predetermined allowable range.

65. The method as claimed in claim 64, wherein re-routing said interconnection is made so as to maximize said ratio of said third total length to said first total length.

66. The method as claimed in claim 62, further comprising the step of: re-routing said interconnection, so as to increase said ration of said third total length to said first total length.

67. The method as claimed in claim 66, wherein re-routing said interconnection is made so as to maximize said ratio of said third total length to said first total length.

68. The method as claimed in claim 62, wherein said ground layer is rectangle-shaped, and said at least longitudinal side region includes a pair of stripe-shaped longitudinal side regions along paired long sides of said ground layer.

69. A computer program for designing a printed board having at least one ground layer, said computer program including the steps of:
finding at least a resonance-significant size for said ground layer;
calculating at least one resonant frequency to said ground layer based on an information of said resonance-significant size of said ground layers.

70. The computer program as claimed in claim 69, wherein said at least one resonant frequency is calculated on the basis that said resonance-significant size is substantially equal to a product of an integer number and a half-wavelength of said at least one resonant frequency.

71. The computer program as claimed in claim 69, wherein said at least one resonant frequency is calculated on the basis that a product of said resonance-significant size and a constant, which is predetermined depending on said ground layer, is substantially equal to a product of an integer number and a half-wavelength of said at least one resonant frequency.

72. The computer program as claimed in claim 71, wherein said constant is larger than 1.

73. The computer program as claimed in claim 69, wherein said resonance-significant size is a length of said ground layer in a longitudinal direction.

74. The computer program as claimed in claim 73, wherein said ground layer is a rectangle shape, and said resonance-significant size is either one of long and short sides lengths of said ground layer.

75. The computer program as claimed in claim 69, further including the step of: verifying whether said resonant frequency is within an allowable frequency range predetermined in accordance with an electromagnetic interference regulation.

76. The computer program as claimed in claim 69, wherein said ground layer comprises a ground plane.

77. A computer program of designing a printed board having at least one ground layer, said computer program including the steps of:
executing a provisional placement of elements over said printed board;
executing a provisional routing of interconnections between said elements; and
executing a re-placement of said elements interconnected to each other through said interconnections, so as to reduce a total length of said interconnections in a resonance-significant direction of a ground layer of said printed board.

78. The computer program as claimed in claim 77, wherein said resonance-significant direction is a longitudinal direction of the ground layer.

79. The computer program as claimed in claim 78, wherein said ground layer is a rectangle shape, and said longitudinal direction is parallel to long sides of said ground layer.

80. The computer program as claimed in claim 77, wherein said re-placement of said elements is made to minimize said total length of said interconnections in said resonance-significant direction.

81. The computer program as claimed in claim 77, wherein said re-placement of said elements is made to change extending directions of said interconnections, so as to reduce said total length of said interconnections in said resonance-significant direction.

82. The computer program as claimed in claim 81, wherein said re-placement of said elements is made to minimize said total length of said interconnections in said resonance-significant direction.

83. The computer program as claimed in claim 77, wherein said ground layer comprises a ground plane.

84. The computer program as claimed in claim 77, wherein said provisional routing of said interconnections is made so as to take a shortest route of said interconnections.

85. A computer program of designing a printed board having at least one ground layer, said computer program including the steps of:
recognizing at least a longitudinal side region adjacent to at least a long side of said ground layer; and
routing at least a designated interconnection between elements placed over said printed board, so as to reduce a total length, in a longitudinal direction of said ground layer, of said interconnection extending on said at least longitudinal side region.

86. The computer program as claimed in claim 85, wherein routing said interconnections is made so as to minimize said total length, in said longitudinal direction, of said interconnections extending on said at least longitudinal side region.

87. The computer program as claimed in claim 85, wherein said ground layer is rectangle-shaped, and said at least longitudinal side region includes a pair of stripe-shaped longitudinal side regions along paired long sides of said ground layer.

88. A computer program of designing a printed board having at least one ground layer, said computer program including the steps of:
recognizing at least a longitudinal side region adjacent to at least a long side of said ground layer; and
finding a first total length, in a longitudinal direction of said ground layer, of an entirety of at least a designated interconnection between elements placed over said printed board, and finding a second total length, in said longitudinal direction, of said interconnection extending on said at least longitudinal side region.

89. The computer program as claimed in claim 88, further comprising the step of: verifying whether a ratio of said second total length to said first total length is within a predetermined allowable range.

90. The computer program as claimed in claim 89, furthermore comprising the step of: re-routing said interconnection, so as to reduce said ratio of said second total length to said first total length, if said ratio of said second total length to said first total length exceeds said predetermined allowable range.

91. The computer program as claimed in claim 90, wherein re-routing said interconnection is made so as to minimize said ratio of said second total length to said first total length.

92. The computer program as claimed in claim 88, further comprising the step of: re-routing said interconnection, so as to reduce said ratio of said second total length to said first total length.

93. The computer program as claimed in claim 92, wherein rerouting said interconnection is made so as to minimize said ratio of said second total length to said first total length.

94. The computer program as claimed in claim 88, wherein said ground layer is rectangle-shaped, and said at least longitudinal side region includes a pair of stripe-shaped longitudinal side regions along paired long sides of said ground layer.

95. A computer program of designing a printed board having at least one ground layer, said computer program including the steps of:
recognizing at least a longitudinal side region adjacent to at least a long side of said ground layer; and
finding a first total length, in a longitudinal direction of said ground layer, of an entirety of at least a designated interconnection between elements placed over said printed board, and finding a third total length, in said longitudinal direction, of said interconnection extending on a center region other than said at least longitudinal side region.

96. The computer program as claimed in claim 95, further comprising the step of: verifying whether a ratio of said third total length to said first total length is within a predetermined allowable range.

97. The computer program as claimed in claim 96, furthermore comprising the step of: re-routing said interconnection, so as to increase said ratio of said third total length to said first total length, if said ratio of said third total length to said first total length exceeds said predetermined allowable range.

98. The computer program as claimed in claim 97, wherein re-routing said interconnection is made so as to maximize said ratio of said third total length to said first total length.

99. The computer program as claimed in claim 95, further comprising the step of: re-routing said interconnection, so as to increase said ratio of said third total length to said first total length.

100. The computer program as claimed in claim 99, wherein re-routing said interconnection is made so as to maximize said ratio of said third total length to said first total length.

101. The computer program as claimed in claim 95, wherein said ground layer is rectangle-shaped, and said at least longitudinal side region includes a pair of stripe-shaped longitudinal side regions along paired long sides of said ground layer.

* * * * *